US011031071B2

(12) United States Patent
Yoon

(10) Patent No.: US 11,031,071 B2
(45) Date of Patent: Jun. 8, 2021

(54) NONVOLATILE MEMORY DEVICE, OPERATING METHOD OF NONVOLATILE MEMORY DEVICE, AND STORAGE DEVICE INCLUDING NONVOLATILE MEMORY DEVICE

(71) Applicant: Samsung Electronics Co., Ltd., Suwon-si (KR)

(72) Inventor: Hyun Jun Yoon, Changwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/943,473

(22) Filed: Jul. 30, 2020

(65) Prior Publication Data
US 2020/0357460 A1 Nov. 12, 2020

Related U.S. Application Data

(63) Continuation-in-part of application No. 16/677,930, filed on Nov. 8, 2019.

(30) Foreign Application Priority Data

Mar. 5, 2019 (KR) .......................... 10-2019-0025359

(51) Int. Cl.
*G11C 7/10* (2006.01)
*G11C 11/4093* (2006.01)
(Continued)

(52) U.S. Cl.
CPC ............ *G11C 11/4093* (2013.01); *G11C 5/06* (2013.01); *G11C 11/4074* (2013.01); *G11C 11/4085* (2013.01); *G11C 11/4094* (2013.01)

(58) Field of Classification Search
CPC ... G11C 11/4093; G11C 5/06; G11C 11/4074; G11C 11/4085; G11C 11/4094
(Continued)

(56) References Cited

U.S. PATENT DOCUMENTS 6,208,560 B1 * 3/2001 Tanaka ................ G11C 11/5621
365/185.22
6,278,636 B1 * 8/2001 Lee ....................... G11C 7/1012
365/185.08
(Continued)

FOREIGN PATENT DOCUMENTS

KR 10-2017-0052390 5/2017

OTHER PUBLICATIONS

U.S. Office Action dated Oct. 30, 2020, for copending U.S. Appl. No. 16/677,930.
(Continued)

*Primary Examiner* — Viet Q Nguyen
(74) *Attorney, Agent, or Firm* — Harness, Dickey & Pierce, P.L.C.

(57) ABSTRACT

A nonvolatile memory device includes a memory cell region including first metal pads and a memory cell array, and a peripheral circuit region including second metal pads, row decoder circuitry that is connected to the rows of the memory cells through word lines and controls voltages of the word lines, and page buffer circuitry that is connected to the columns of the memory cells through bit lines. The page buffer circuitry is configured to obtain first values by performing a first sensing operation on first bit lines of the bit lines through the first transistors and obtain second values by performing a second sensing operation on the second bit lines of the bit lines through the second transistors, wherein the first values or the second values are inverted. The peripheral circuit region is vertically connected to the memory cell region by the metal pads directly.

19 Claims, 16 Drawing Sheets

(51) Int. Cl.
    *G11C 11/4094*     (2006.01)
    *G11C 5/06*     (2006.01)
    *G11C 11/4074*     (2006.01)
    *G11C 11/408*     (2006.01)

(58) Field of Classification Search
    USPC .............................................. 365/230.06, 63
    See application file for complete search history.

(56) References Cited

U.S. PATENT DOCUMENTS

| | | | |
|---|---|---|---|
| 6,780,707 B2* | 8/2004 | Lee | H01L 21/76895 |
| | | | 438/241 |
| 6,813,207 B2 | 11/2004 | Honda | |
| 6,925,005 B2 | 8/2005 | Kawamura et al. | |
| 7,313,020 B2 | 12/2007 | Chae et al. | |
| 7,366,033 B2 | 4/2008 | Park et al. | |
| 7,679,133 B2 | 3/2010 | Son et al. | |
| 8,553,466 B2 | 10/2013 | Han et al. | |
| 8,559,225 B2* | 10/2013 | Lee | G11C 16/26 |
| | | | 365/185.12 |
| 8,559,235 B2 | 10/2013 | Yoon et al. | |
| 8,654,587 B2 | 2/2014 | Yoon et al. | |
| 9,443,580 B2 | 9/2016 | Muralimanohar et al. | |
| 9,515,083 B2* | 12/2016 | Lee | H01L 24/05 |
| 9,530,467 B1 | 12/2016 | Lee | |
| 9,601,211 B1* | 3/2017 | Yang | G06F 13/1673 |
| 10,061,538 B2* | 8/2018 | Park | G11C 11/5635 |
| 10,141,273 B2* | 11/2018 | Watanabe | H01L 24/97 |
| 10,665,312 B2* | 5/2020 | Bang | G11C 16/28 |
| 2003/0021172 A1* | 1/2003 | Cho | G11C 16/26 |
| | | | 365/203 |
| 2006/0221739 A1* | 10/2006 | Kim | G11C 16/24 |
| | | | 365/203 |
| 2007/0058446 A1* | 3/2007 | Hwang | G11C 16/3459 |
| | | | 365/185.29 |
| 2009/0052241 A1* | 2/2009 | Baek | G11C 11/5642 |
| | | | 365/185.03 |
| 2009/0161443 A1* | 6/2009 | Yang | G11C 16/10 |
| | | | 365/189.05 |
| 2010/0329036 A1* | 12/2010 | Park | G11C 16/3418 |
| | | | 365/185.25 |
| 2011/0233648 A1 | 9/2011 | Seol et al. | |
| 2012/0269007 A1* | 10/2012 | Yang | G11C 7/00 |
| | | | 365/189.05 |
| 2018/0204619 A1 | 7/2018 | Futatsuyama et al. | |
| 2019/0198121 A1* | 6/2019 | Choo | G11C 16/28 |

OTHER PUBLICATIONS

U.S. Notice of Allowance dated Jan. 28, 2021 issued in corresponding U.S. Appl. No. 16/677,930.

\* cited by examiner

NONVOLATILE MEMORY DEVICE, OPERATING METHOD OF NONVOLATILE MEMORY DEVICE, AND STORAGE DEVICE INCLUDING NONVOLATILE MEMORY DEVICE

CROSS-REFERENCE TO RELATED APPLICATIONS

This U.S. non-provisional patent application is a continuation-in-part application of U.S. non-provisional patent application Ser. No. 16/677,930 filed on Nov. 8, 2019, which claims priority under 35 U.S.C. § 119 to Korean Patent Application No. 10-2019-0025359 filed on Mar. 5, 2019, in the Korean Intellectual Property Office, the disclosure of which are incorporated by reference herein in its entirety.

BACKGROUND

Some example embodiments of some inventive concept disclosed herein relate to semiconductor circuits including nonvolatile memory devices, operating methods of the nonvolatile memory device, and/or storage devices including nonvolatile memory devices.

A storage device may be configured to store data under control of a host device, such as a computer, a smartphone, and a smart pad. As an example, a storage device may store data on a magnetic disk, such as a hard disk drive (HDD), or a semiconductor memory, in particular, a nonvolatile memory, such as a solid state drive (SSD) or a memory card.

Some example of nonvolatile memory include read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), ferroelectric RAM (FRAM), etc.

Some nonvolatile memory devices may be configured to store data in memory cells. Various ways exist to read memory cells of the nonvolatile memory device according to an operating characteristic of the nonvolatile memory device and a request to access and/or manage the nonvolatile memory device. However, there is still room for introduction of new ways to read memory cells that may present improved speed and/or reliability of the nonvolatile memory device.

SUMMARY

Some example embodiments of some inventive concepts include a memory devices that are capable of improving a speed at which states of data stored in memory cells of the nonvolatile memory device are determined, operating methods of the nonvolatile memory device, and/or storage devices including the nonvolatile memory devices.

According to some example embodiments, a nonvolatile memory device includes a memory cell region including first metal pads and a memory cell array that includes memory cells arranged in rows and columns, and a peripheral circuit region including row decoder circuitry that is connected to the rows of the memory cells through word lines and configured to control voltages of the word lines, and a page buffer circuitry that is connected to the columns of the memory cells through bit lines, and including first transistors configured to transfer voltages of the bit lines to be sensed and second transistors configured to transfer the voltages of the bit lines to be inverted and sensed, wherein the page buffer circuitry is configured to obtain first values by performing a first sensing operation on first bit lines of the bit lines, and obtain second values by performing a second sensing operation on the second bit lines of the bit lines, wherein the peripheral circuit region is vertically connected to the memory cell region by the first metal pads and the second metal pads.

According to some example embodiments, a storage device may include a nonvolatile memory device that includes first memory cells connected to first bit lines, second memory cells connected to second bit lines, and controller circuitry that is configured to control the nonvolatile memory device to, in response to a request, perform a first sensing operation of reading the first memory cells; perform a second sensing operation of reading the first memory cells and the second memory cells after the first sensing operation; and perform a third sensing operation of reading the second memory cells after the second sensing operation. The nonvolatile memory device comprises a memory cell region including first metal pads, the first memory cells and the second memory cells, and a peripheral circuit region including second metal pads and access the memory cell region under the control of the controller circuitry. The peripheral circuit region is vertically connected to the memory cell region by the first metal pads and the second metal pads.

According to some example embodiments, an operating method of a nonvolatile memory device which includes first memory cells, second memory cells, first bit lines connected to the first memory cells, and second bit lines connected to the second memory cells, wherein the operating method may include applying a precharge voltage to the first bit lines and the second bit lines, performing a first sensing operation on the first bit lines to obtain first values, and performing a second sensing operation on the second bit lines to obtain second values, and to invert ones of the first values and the second values. The nonvolatile memory device comprises a memory cell region including first metal pads, the first memory cells and the second memory cells, and a peripheral circuit region including second metal pads and connected to the memory cell region through the second metal pads, the first metal pads, the word lines and the bit lines. The peripheral circuit region is vertically connected to the memory cell region by the first metal pads and the second metal pads.

BRIEF DESCRIPTION OF THE FIGURES

The above and other objects and features of some inventive concepts will become apparent by describing in detail some example embodiments thereof with reference to the accompanying drawings.

DETAILED DESCRIPTION

Below, some example embodiments of some inventive concepts are described in detail.

Figure 1:
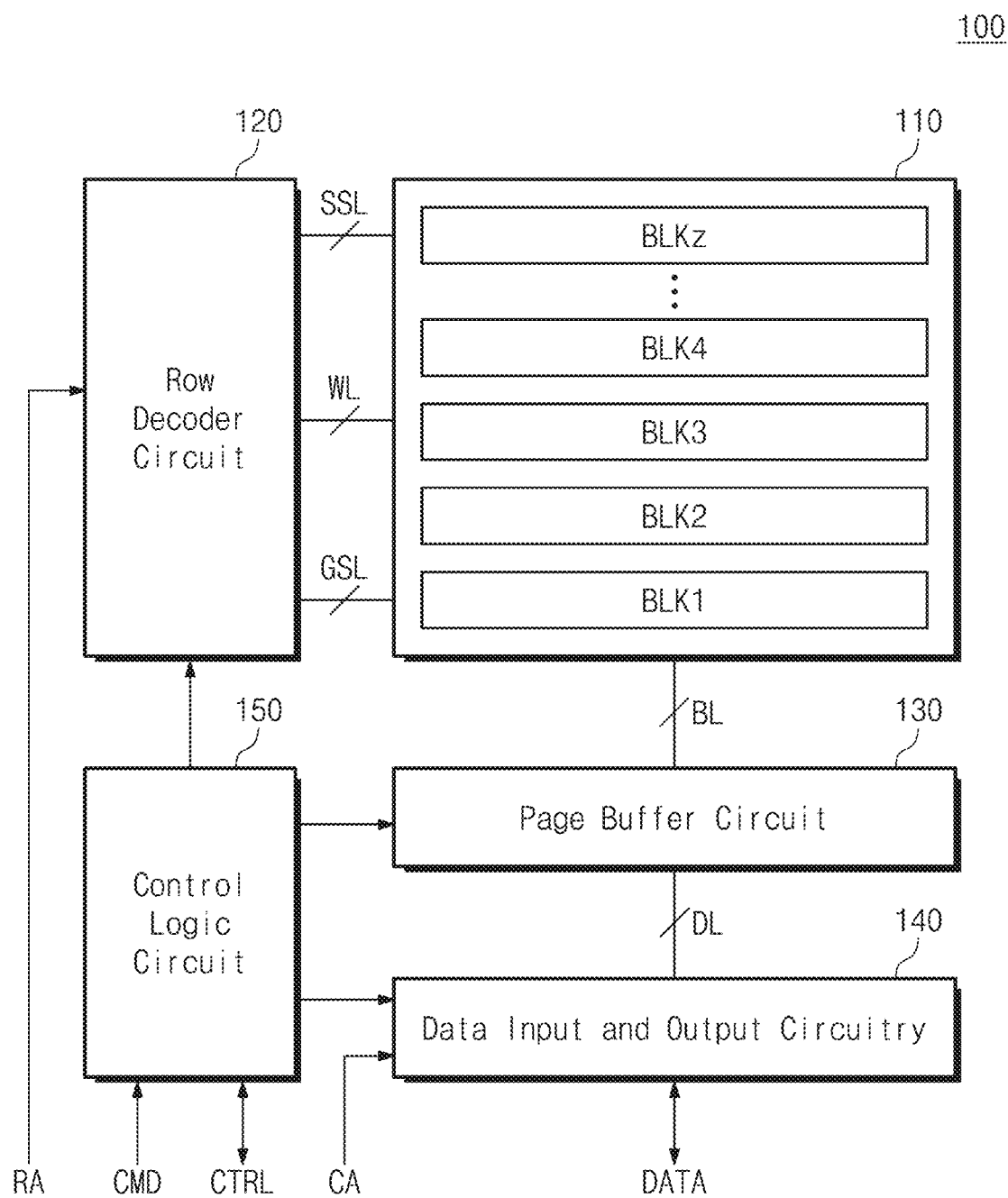
FIG. 1 is a block diagram illustrating a nonvolatile memory device according to some example embodiments of some inventive concept.

FIG. 1 is a block diagram illustrating a nonvolatile memory device 100 according to some example embodiments of some inventive concepts. Referring to FIG. 1, the nonvolatile memory device 100 includes a memory cell array 110, row decoder circuitry 120, page buffer circuitry 130, data input and output circuitry 140, and control logic circuitry 150.

The memory cell array 110 includes a plurality of memory blocks BLK1 to BLKz. Each of the memory blocks BLK1 to BLKz includes a plurality of memory cells. Each of the memory blocks BLK1 to BLKz may be connected to the row decoder circuitry 120 through at least one ground selection line GSL, word lines WL, and at least one string selection line SSL. Some of the word lines WL may be used as dummy word lines.

Each of the memory blocks BLK1 to BLKz may be connected to the page buffer circuitry 130 through a plurality of bit lines BL. For example, the plurality of memory blocks BLK1 to BLKz may be connected in common to the plurality of bit lines BL, or different memory blocks may be connected to different bit lines BL. The memory cells of the plurality of memory blocks BLK1 to BLKz may have the same or similar structures or different structures.

In some example embodiments, each of the memory blocks BLK1 to BLKz may correspond to a unit of an erase operation. The memory cells of the memory cell array 110 may be erased in the unit of a memory block. The memory cells belonging to one memory block may be erased at the same time. In another example embodiment, each of the memory blocks BLK1 to BLKz may be divided into a plurality of sub-blocks. Each of the plurality of sub-blocks may correspond to a unit of the erase operation.

The row decoder circuitry 120 may be connected to the memory cell array 110 through ground selection lines GSL, the word lines WL, and string selection lines SSL. The row decoder circuitry 120 may operate under control of the control logic circuitry 150.

The row decoder circuitry 120 may decode a row address RA received from an external device (e.g., controller circuitry 420 of FIG. 14) through a first channel (e.g., an input and output channel) and may control voltages to be applied to the string selection lines SSL, the word lines WL, and the ground selection lines GSL based on the decoded address.

The page buffer circuitry 130 may be connected to the memory cell array 110 through the plurality of bit lines BL. In some example embodiments, first memory cells of the memory cell array 110 may be connected to first bit lines BL, such as even-numbered bit lines BL2, BL4, etc., and second memory cells of the memory cell array 110 may be connected to second bit lines BL, such as odd-numbered bit lines BL1, BL3, etc. The page buffer circuitry 130 may be connected with the data input and output circuitry 140 through a plurality of data lines DL. The page buffer circuitry 130 may operate under control of the control logic circuitry 150.

In an example write operation, the page buffer circuitry 130 may store data to be written into memory cells. The page buffer circuitry 130 may apply voltages to one or more of the plurality of bit lines BL based on the stored data. In an example read operation or in an example verification read operation that may be performed in a write operation or an erase operation, the page buffer circuitry 130 may sense voltages of the bit lines BL and, in some examples, may store a result of the sensing.

The data input and output circuitry 140 may be connected with the page buffer circuitry 130 through the plurality of data lines DL. The data input and output circuitry 140 may receive a column address CA through the first channel. The data input and output circuitry 140 may output data read by the page buffer circuitry 130 to the external device through the first channel, based on the column address CA. The data input and output circuitry 140 may provide data received from the external device through the first channel to the page buffer circuitry 130 based on the column address CA.

The control logic circuitry 150 may receive a command CMD through the first channel from the external device and/or may exchange a control signal CTRL with the external device through a second channel (e.g., a control channel). The control logic circuitry 150 may receive the command CMD through the first channel in response to the control signal CTRL, may respectively route the row address RA and the column address CA received through the first channel to the row decoder circuitry 120 and the data input and output circuitry 140, and/or may route data "DATA" received through the first channel to the data input and output circuitry 140.

The control logic circuitry 150 may decode the received command CMD and, in some examples, may control the nonvolatile memory device 100 based on the decoded command. For example, the control logic circuitry 150 may allow the row decoder circuitry 120 and the page buffer circuitry 130 to perform a check operation for checking states of memory cells. In some example embodiments, a check operation may involve the page buffer circuitry 130 sensing voltages of the bit lines BL by using two or more different methods.

Figure 2:
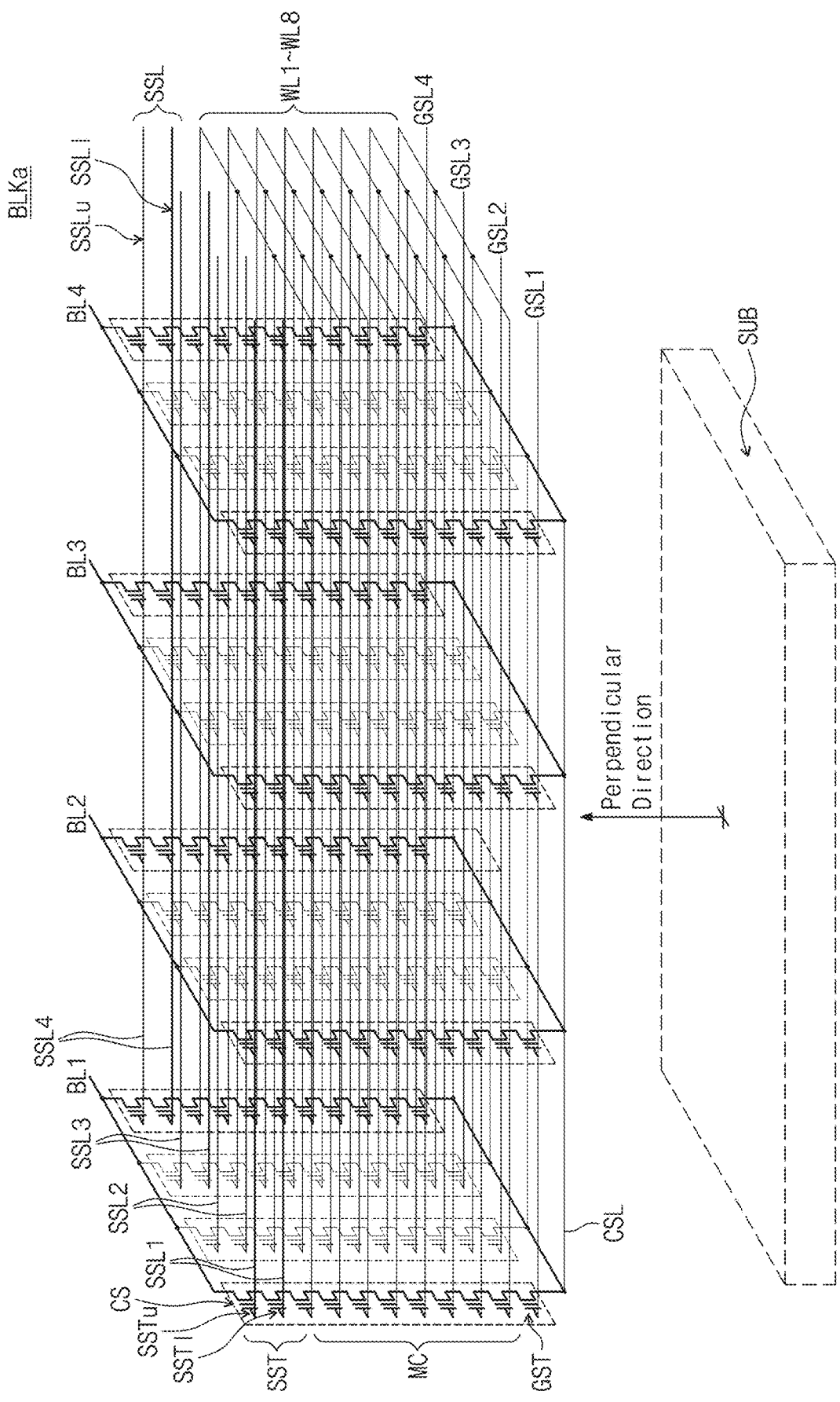
FIG. 2 is a circuit diagram illustrating an example of one memory block of memory blocks of FIG. 1.

FIG. 2 is a circuit diagram of an example of one memory block BLKa of the memory blocks BLK1 to BLKz of FIG. 1. Referring to FIGS. 1 and 2, a plurality of cell strings CS may be arranged on (or in) a substrate SUB in rows and columns. The cell strings may be connected in common to a common source line CSL that is formed on (or in) the substrate SUB. In FIG. 2, a position of the substrate SUB is included as an example of a structure of the memory block BLKa.

In example embodiments such as illustrated in FIG. 2, the common source line CSL may be connected to lower ends of the cell strings CS. In some example embodiments, the common source line CSL may be physically located at the lower ends of the cell strings CS. An example embodiment is illustrated in FIG. 2 in which the cell strings CS are arranged in a 4×4 matrix. In other example embodiments, the configuration of the cell strings CS may vary; for example, the number of cell strings CS in the memory block BLKa may be larger or smaller.

The cell strings CS of each row may be connected to the corresponding ground selection lines of first to fourth ground selection lines GSL1 to GSL4 and/or to the corresponding string selection line of first to fourth string selection lines SSL1 to SSL4. The cell strings CS of each column may be connected to a corresponding bit line of first to fourth bit lines BL1 to BL4. For brief illustration, the cell strings CS connected to the second and third string selection lines SSL2 and SSL3 are shown as dotted lines.

Each of the cell strings CS may include at least one ground selection transistor GST connected to the ground selection line GSL, a plurality of memory cells MC1 to MC8 respectively connected to a plurality of word lines WL1 to WL8, and/or string selection transistors SST, which may be respectively connected to the string selection lines SSL1, SSL2, SSL3, or SSL4. For example, a string selection line that is closer to the bit lines BL1 to BL4 from among the string selection lines SSL1 of a first row may be an upper string selection line, which may be marked with "SSL1*u*" using a reference sign of "u". A string selection line that is closer to the memory cells MC1 to MC8 from among the string selection lines SSL1 of the first row may be a lower string selection line, which is marked with "SSL1*l*" using a reference sign of "l". That is, the first string selection lines SSL1 may include a first upper string selection line SSL1*u* and a first lower string selection line SSL1*l*. The second string selection lines SSL2 may include a second upper string selection line SSL2*u* and a second lower string selection line SSL2*l*. The third string selection lines SSL3 may include a third upper string selection line SSL3*u* and a third lower string selection line SSL3*l*. The fourth string selection lines SSL4 may include a fourth upper string selection line SSL4*u* and a fourth lower string selection line SSL4*l*. Likewise, the string selection transistors SST of the first row may include a first upper string selection transistor SST1*u* and a first lower string selection transistor SST1*l*. The string selection transistors SST of the second row may include a second upper string selection transistor SST2*u* and a second lower string selection transistor SST2*l*. The string selection transistors SST of the third row may include a third upper string selection transistor SST3*u* and a third lower string selection transistor SST3*l*. The string selection transistors SST of the fourth row may include a fourth upper string selection transistor SST4*u* and a fourth lower string selection transistor SST4*l*.

In each cell string CS, the ground selection transistor GST, the memory cells MC1 to MC8, and/or the string selection transistors SST may be connected (for example, in series) along a direction perpendicular to the substrate SUB and/or may be sequentially stacked along the direction perpendicular to the substrate SUB. In each cell string CS, one or more of the memory cells MC1 to MC8 may be used as (a) dummy memory cell(s). In some example embodiments, the dummy memory cell(s) may be program-inhibited, that is, not programmed; in other example embodiments, the dummy memory cell(s) may be programmed differently from the memory cells MC1 to MC8.

Figure 3:
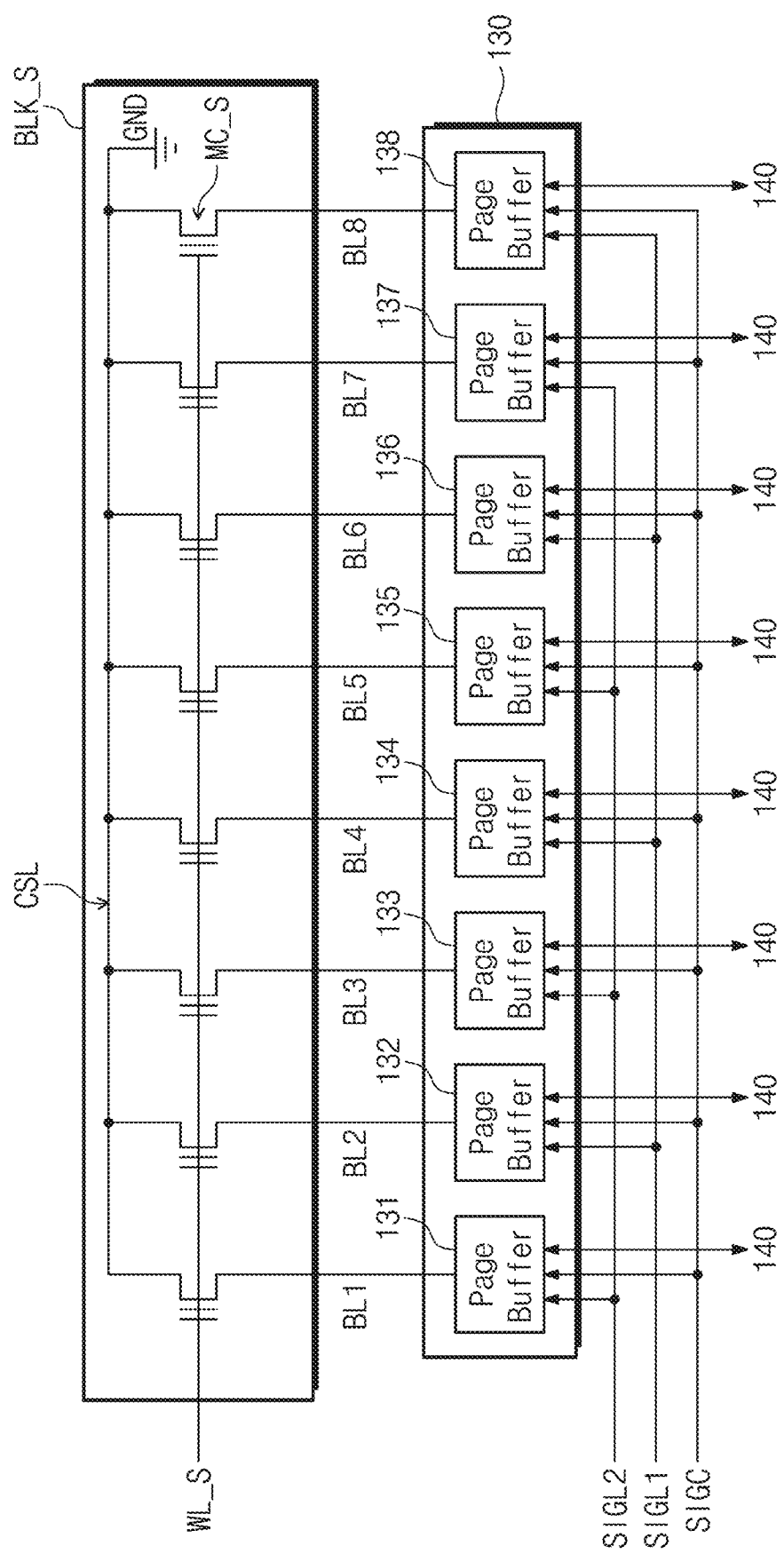
FIG. 3 illustrates selected memory cells in a selected memory block of a memory cell array and page buffer circuitry.

FIG. 3 illustrates an example embodiment including selected memory cells MC_S in a selected memory block BLK_S of the memory cell array 110 and the page buffer circuitry 130. Components corresponding to first to eighth bit lines BL1 to BL8 are illustrated in FIG. 3 as an example. Referring to FIGS. 1 to 3, when states of memory cells MC_S selected from the memory cells MC1 to MC8 of the selected memory block BLK_S are sensed, the row decoder circuitry 120 may apply a first pass voltage to unselected word lines of the word lines WL of the selected memory block BLK_S. The first pass voltage may turn on the unselected memory cells. Accordingly, the unselected memory cells are turned on and function as a channel transferring a voltage. Unselected memory cells of the selected memory block BLK_S are omitted from FIG. 3.

When the selected memory cells MC_S of the selected memory block BLK_S are sensed, the row decoder circuitry 120 may apply a second pass voltage to selected string selection lines corresponding to the selected memory cells MC_S and may apply a first OFF voltage to unselected string selection lines. The second pass voltage may turn on the selected string selection transistors corresponding to the selected memory cells MC_S. Accordingly, the selected string selection transistors may function as a channel transferring a voltage and are omitted from FIG. 3. The first OFF voltage may turn off unselected string selection transistors. Accordingly, cell strings corresponding to the unselected string selection transistors are electrically disconnected from the first to eighth bit lines BL1 to BL8. Electrically disconnected cell strings are omitted from FIG. 3.

When the selected memory cells MC_S of the selected memory block BLK_S are sensed, the row decoder circuitry 120 may apply a third pass voltage to a selected ground selection line corresponding to the selected memory cells MC_S and may apply a second OFF voltage to an unselected ground selection line. The third pass voltage may turn on selected ground selection transistors corresponding to the selected memory cells MC_S. Accordingly, the selected ground selection transistors may function as a channel transferring a voltage and are omitted from FIG. 3. The second OFF voltage may turn off unselected ground selection transistors. Accordingly, cell strings corresponding to the unselected ground selection transistors are electrically disconnected from a common source line CSL. Electrically disconnected cell strings are omitted from FIG. 3.

When the selected memory cells MC_S of the selected memory block BLK_S are sensed, as illustrated in FIG. 3, the memory cell array 110 may be simplified to a state where the selected memory cells MC_S are connected between the first to eighth bit lines BL1 to BL8 and the common source line CSL to which a ground voltage GND is supplied.

When the selected memory cells MC_S of the selected memory block BLK_S are sensed, the row decoder circuitry 120 may apply a voltage (e.g., a read voltage) for sensing to a selected word line WL_S. The page buffer circuitry 130 may sense voltages of the first to eighth bit lines BL1 to BL8 and may determine whether threshold voltages of the selected memory cells MC_S are greater than (or equal to or smaller than) a sensing voltage. The first to eighth page buffers 131 to 138 may output a result of the sensing operation to the data input and output circuitry 140.

The page buffer circuitry 130 may include the first to eighth page buffers 131 to 138 respectively corresponding to the first to eighth bit lines BL1 to BL8. When the selected memory cells MC_S of the selected memory block BLK_S are sensed, the first to eighth page buffers 131 to 138 may be divided into two or more groups, and the page buffers of the groups may controlled to differently sense voltages of corresponding bit lines.

For example, even-numbered page buffers 132, 134, 136, and 138 of the first to eighth page buffers 131 to 138 may constitute a first page buffer group. Bit lines connected to the page buffers 132, 134, 136, and 138 of the first group, that even-numbered bit lines BL2, BL4, BL6, and BL8 of the first to eighth bit lines BL1 to BL8 may constitute a first bit line group.

For example, odd-numbered page buffers 131, 133, 135, and 137 of the first to eighth page buffers 131 to 138 may constitute a second page buffer group. Bit lines connected to the page buffers 131, 133, 135, and 137 of the second group, that odd-numbered bit lines BL1, BL3, BL5, and BL7 of the first to eighth bit lines BL1 to BL8 may constitute a second bit line group.

In an example embodiment, page buffers and bit lines may be grouped with respect to an even number and an odd number, but some example embodiments of some inventive concepts are not limited thereto. For example, a reference for grouping page buffers and bit lines may be modified or changed based on an operating characteristic or a process characteristic of the nonvolatile memory device 100.

In some example embodiments, first signal lines SIGL1 for controlling the page buffers 132, 134, 136, and 138 of the first group and second signal lines SIGL2 for controlling the page buffers 131, 133, 135, and 137 of the second group may be separately provided such that the page buffers 132, 134, 136, and 138 of the first group and the page buffers 131, 133, 135, and 137 of the second group may sense voltages of corresponding bit lines using different methods.

In some example embodiments, common signal lines SIGC for controlling a common portion of an operation of the page buffers 132, 134, 136, and 138 of the first group and an operation of the page buffers 131, 133, 135, and 137 of the second group may be provided in common to the page buffers 132, 134, 136, and 138 of the first group and the page buffers 131, 133, 135, and 137 of the second group.

Figure 4:
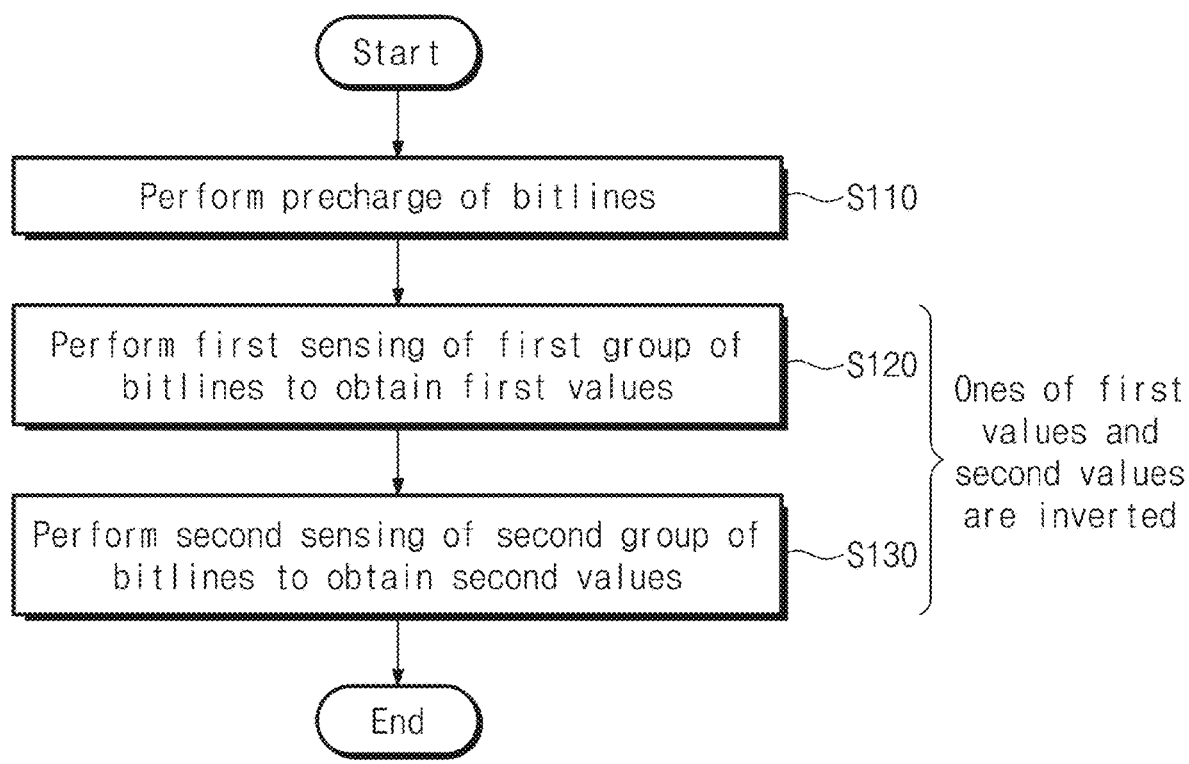
FIG. 4 is a flowchart illustrating an operating method of a nonvolatile memory device according to some example embodiments of some inventive concepts.

FIG. 4 is a flowchart illustrating an operating method of the nonvolatile memory device 100 according to an embodiment. Referring to FIGS. 1, 3, and 4, in operation S110, the page buffer circuitry 130 may precharge the first to eighth bit lines BL1 to BL8. The first to eighth page buffers 131 to 138 may apply a voltage (e.g., a power supply voltage) to the first to eighth bit lines BL1 to BL8, respectively.

In operation S120, the page buffers 132, 134, 136, and 138 of the first group may perform a first sensing operation on the bit lines BL2, BL4, BL6, and BL8 of the first group and may obtain first values. In operation S130, the page buffers 131, 133, 135, and 137 of the second group may perform a second sensing operation on the bit lines BL1, BL3, BL5, and BL7 of the second group and may obtain second values.

The first sensing operation may be different from the second sensing operation. For example, one of a result of the first sensing operation and a result of the second sensing operation may be inverted. As an example, the first values may be obtained as the result of the first sensing operation, and the second values may be obtained by inverting the result of the second sensing operation. As another example, the first values may be obtained by inverting the result of the first sensing operation, and the second values may be obtained as the result of the second sensing operation. As an example, the first sensing operation and the second sensing operation may be performed at the same time and/or at least partially concurrent. As another example, the first sensing operation and the second sensing operation may be performed sequentially, such as consecutively within a time period.

Figure 5:
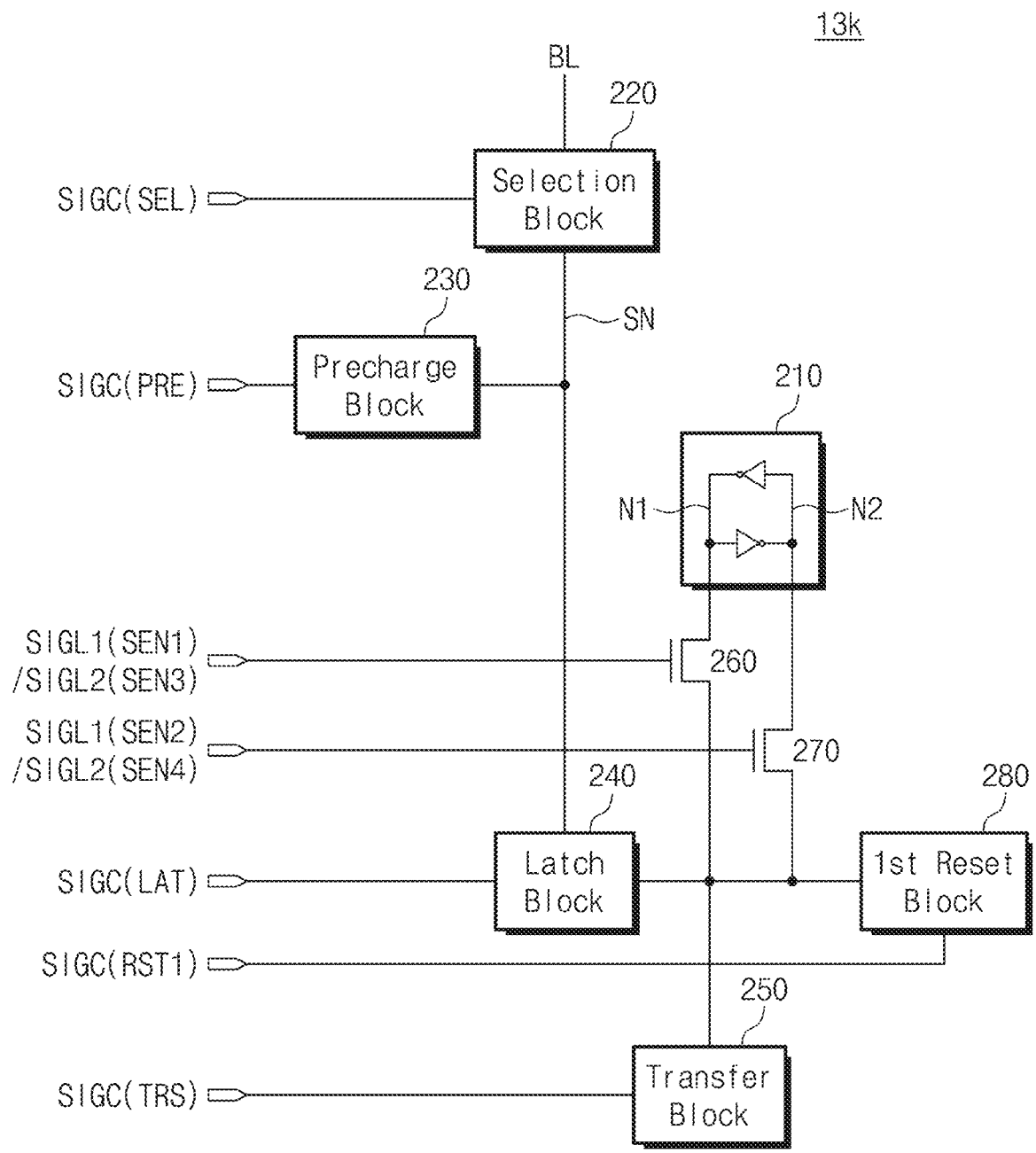
FIG. 5 illustrates an example of a k-th page buffer being one of first to eighth page buffers.

FIG. 5 illustrates an example of a k-th page buffer 13k being one of the first to eighth page buffers 131 to 138. In the example embodiment of FIG. 5, components associated with a sensing operation from among components of the k-th page buffer 13k are illustrated, and the remaining components are omitted. In an example embodiment, structures of the first to eighth page buffers 131 to 138 may be the same as the structure illustrated in FIG. 5. In some example embodiments, the page buffer circuitry 130 may be configured to perform the first sensing operation and/or the second sensing operation. Further, the page buffer circuitry 130 may be configured to cause ones of first sensing voltages of the first sensing operation and second sending voltages of the second sensing operation to be inverted in various ways. As a such example, the page buffer circuitry 130 may cause the sensing voltages of selected ones of the bit lines BL to be inverted before during the first sensing operation or the second sensing operation.

In some example embodiments and as shown in FIGS. 1, 3, and 5, a k-th page buffer 13k may include a sensing latch 210, a selection block 220, a precharge block 230, a latch block 240, a transfer block 250, a first transistor 260, a second transistor 270, and a first reset block 280.

In some example embodiments, the controller circuitry 420 (see FIG. 14) may be configured to control the nonvolatile memory device 100 to store a result of the first sensing operation for the first memory cells in the first sensing operation and to invert and store a result of the second sensing operation for the first memory cells. For example, the sensing latch 210 may include inverters connected between a first node N1 and a second node N2. The inverters may be cross coupled. The sensing latch 210 may be configured to store a result of performing a sensing operation on a bit line BL.

The selection block 220 is connected between the bit line BL and a sensing node SN. The selection block 220 may be controlled by a selection signal SEL that is provided through a signal line (e.g., a first common signal line) of the common signal lines SIGC. That is, the selection blocks 220 of the first to eighth page buffers 131 to 138 may be simultaneously controlled in common by the selection signal SEL of the first common signal line. In response to the selection signal SEL, the selection block 220 may electrically connect the sensing node SN and the bit line BL or may disconnect the sensing node SN from the bit line BL.

The precharge block 230 is connected to the sensing node SN. The precharge block 230 may be controlled by a precharge signal PRE that is provided through a signal line (e.g., a second common signal line) of the common signal lines SIGC. That is, the precharge blocks 230 of the first to eighth page buffers 131 to 138 may be simultaneously controlled in common by the precharge signal PRE of the second common signal line. In some example embodiments, the page buffer circuitry 130 may be configured to apply a precharge voltage to the bit lines BL before performing the first sensing operation and the second sensing operation. For example, the precharge block 230 may apply a precharge voltage to the sensing node SN in response to the precharge signal PRE.

The latch block 240 is connected to the sensing node SN and is connected to the first transistor 260 and the second transistor 270. The latch block 240 may be controlled by a latch signal LAT that is provided through a signal line (e.g., a third common signal line) of the common signal lines SIGC. That is, the latch blocks 240 of the first to eighth page buffers 131 to 138 may be simultaneously controlled in common by the latch signal LAT of the third common signal line. The latch block 240 may transfer a voltage of the sensing node SN to the first transistor 260 and the second transistor 270 in response to the latch signal LAT.

The transfer block 250 is connected to the first transistor 260 and the second transistor 270. The transfer block 250 may be controlled by a transfer signal TRS that is provided through a signal line (e.g., a fourth common signal line) of the common signal lines SIGC. That is, the transfer blocks 250 of the first to eighth page buffers 131 to 138 may be simultaneously controlled in common by the transfer signal TRS of the fourth common signal line. The transfer block 250 may output a voltage provided from the first transistor 260 or the second transistor 270 to the outside in response to the transfer signal TRS.

The first transistor 260 is connected between the first node N1 of the sensing latch 210 and the latch block 240. When the k-th page buffer 13k belongs to the first group of the page buffers 132, 134, 136, and 138, the first transistor 260 may be controlled by a first sensing signal SEN1 that is transferred through a signal line (e.g., a first line) of the first signal lines SIGL1. That is, the first transistors 260 of the page buffers 132, 134, 136, and 138 of the first group may be simultaneously controlled in common by the first sensing signal SEN1 of the first line of the first signal lines SIGL1.

The second transistor 270 is connected between the second node N2 of the sensing latch 210 and the latch block 240. When the k-th page buffer 13k belongs to the first group of the page buffers 132, 134, 136, and 138, the second transistor 270 may be controlled by a second sensing signal SEN2 that is transferred through a signal line (e.g., a second line) of the first signal lines SIGL1. That is, the second transistors 270 of the page buffers 132, 134, 136, and 138 of the first group may be simultaneously controlled in common by the second sensing signal SEN2 of the second line of the first signal lines SIGL1.

When the k-th page buffer 13k belongs to the second group of the page buffers 131, 133, 135, and 137, the first transistor 260 may be controlled by a third sensing signal SEN3 that is transferred through a signal line (e.g., a first line) of the second signal lines SIGL2. That is, the first transistors 260 of the page buffers 131, 133, 135, and 137 of the second group may be simultaneously controlled in common by the third sensing signal SEN3 of the first signal line of the second signal lines SIGL2.

When the k-th page buffer 13k belongs to the second group of the page buffers 131, 133, 135, and 137, the second transistor 270 may be controlled by a fourth sensing signal SEN4 that is transferred through a signal line (e.g., a second line) of the second signal lines SIGL2. That is, the second transistors 270 of the page buffers 131, 133, 135, and 137 of the second group may be simultaneously controlled in common by the fourth sensing signal SEN4 of the second line of the second signal lines SIGL2.

The first reset block 280 is connected to the first transistor 260 and the second transistor 270. The first reset block 280 may be controlled by a first reset signal RST1 that is provided through a signal line (e.g., a fifth common signal line) of the common signal lines SIGC. That is, the first reset blocks 280 of the first to eighth page buffers 131 to 138 may be simultaneously controlled in common by the first reset signal RST1 of the fifth common signal line. The first reset block 280 may apply the ground voltage (or a power supply voltage) to the first transistor 260 or the second transistor 270 in response to the first reset signal RST1.

Figure 6:
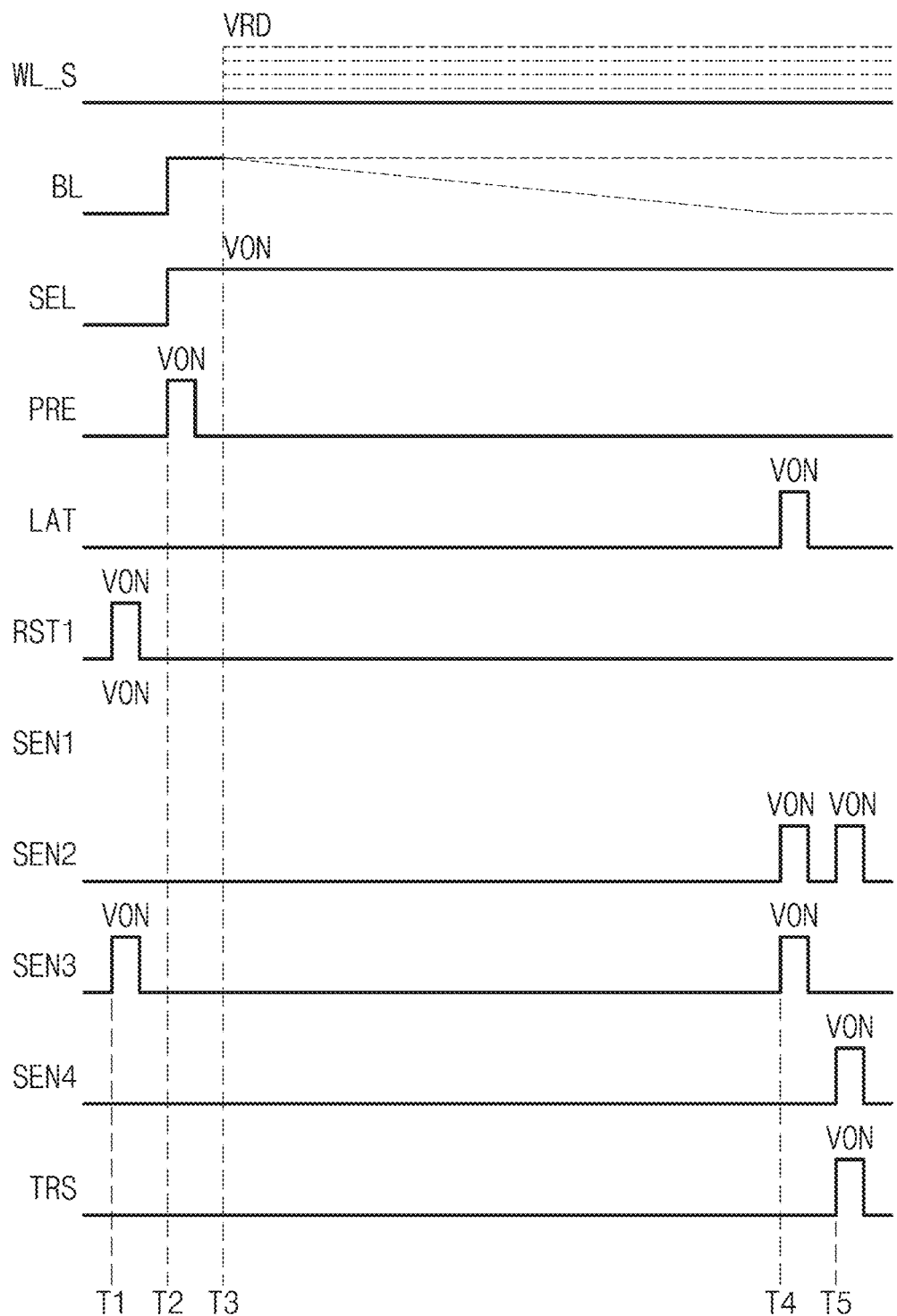
FIG. 6 is a timing diagram of signals applied to page buffer circuitry when threshold voltages of selected memory cells are sensed.

FIG. 6 is a timing diagram of signals applied to the page buffer circuitry 130 when threshold voltages of the selected memory cells MC_S are sensed. Referring to FIGS. 1, 3, 5, and 6, at a first time T1, the first reset signal RST1 is activated and is set to an ON voltage VON. When the first reset signal RST1 is set to the ON voltage VON, the first reset block 280 may apply the power supply voltage to the first transistor 260 and the second transistor 270.

When the page buffer 13k belongs to the first group of the page buffers 132, 134, 136, and 138, the page buffer 13k may receive the first sensing signal SEN1 and the second sensing signal SEN2. At the first time T1, the second sensing signal SEN2 maintains an inactive state, and the first sensing signal SEN1 is activated and is set to the ON voltage VON. The ON voltage VON may turn on the first transistor 260.

As the first transistor 260 is turned on, the first node N1 of the sensing latch 210 may be set to the power supply voltage (e.g., a high level). The second node N2 of the sensing latch 210 may be set to an opposite voltage to the power supply voltage, for example, the ground voltage (e.g., a low level).

When the page buffer 13k belongs to the second group of the page buffers 131, 133, 135, and 137, the page buffer 13k may receive the third sensing signal SEN3 and the fourth sensing signal SEN4. At the first time T1, the fourth sensing signal SEN4 maintains an inactive state, and the third sensing signal SEN3 is activated and is set to the ON voltage VON. The ON voltage VON may turn on the first transistor 260.

As the first transistor 260 is turned on, the first node N1 of the sensing latch 210 may be set to the high level. The second node N2 of the sensing latch 210 may be set to the opposite level to the high voltage, for example, the low level.

At a second time T2, the precharge signal PRE is activated and is set to the ON voltage VON. As the precharge signal PRE is set to the ON voltage VON, the precharge block 230 may apply a voltage, for example, the power supply voltage, to the sensing node SN.

At the second time T2, the selection signal SEL is activated and is set to the ON voltage VON. As the selection signal SEL is set to the ON voltage VON, the selection block 220 may electrically connect the bit line BL and the sensing node SN. As the bit line BL and the sensing node SN are electrically connected, the bit line BL may be charged (e.g., precharged) with a voltage, for example, the power supply voltage.

At a third time T3, the row decoder circuitry 120 may apply a read voltage VRD to the selected word line WL_S. The read voltage VRD may have a level targeted for comparison with the threshold voltages of the selected memory cells MC_S from among of various levels illustrated in FIG. 6.

When a threshold voltage of a selected memory cell connected to the bit line BL connected with the page buffer 13k is greater than the read voltage VRD, the selected memory cell may be turned off. In this case, the precharged voltage of the bit line BL may be maintained. When the threshold voltage of the selected memory cell connected to the bit line BL connected with the page buffer 13k is equal to or smaller than the read voltage VRD, the selected memory cell may be turned on. In this case, the precharged voltage of the bit line BL may be discharged.

An example is described with reference to FIG. 6 as the read voltage VRD is applied to the selected word line WL_S after the precharge operation. However, the timing when the precharge operation is performed and the timing when the read voltage VRD is applied to the selected word line WL_S may be variously changed and modified.

At a fourth time T4, the latch signal LAT is activated and is set to the ON voltage VON. The second sensing signal SEN2 and the third sensing signal SEN3 are also activated and are set to the ON voltage VON. The first sensing signal SEN1 and the fourth sensing signal SEN4 may maintain the inactive state.

When the page buffer 13*k* belongs to the first group of the page buffers 132, 134, 136, and 138, the page buffer 13*k* may receive the second sensing signal SEN2. As the second sensing signal SEN2 is activated and is set to the ON voltage, the latch block 240 may be connected to the sensing latch 210 through the second transistor 270.

When the latch signal LAT is set to the ON voltage VON, the latch block 240 may apply a voltage level of the sensing node SN to the second node N2 of the sensing latch 210 through the second transistor 270. As described above, the first node N1 of the sensing latch 210 may be of the power supply voltage (e.g., the high level) or the ground voltage (e.g., the low level) according to any operations after the second time T2 and before the fourth time T4. More detailed embodiments are illustrated in conjunction with FIG. 12.

When a voltage of the sensing node SN is the precharged voltage, the latch block 240 may adjust a voltage of the second node N2 of the sensing latch 210 to the ground voltage through the second transistor 270 in response to the ON voltage of the latch signal LAT. In this case, the second node N2 of the sensing latch 210 may be set to the ground voltage.

When a voltage of the sensing node SN is the ground voltage, the latch block 240 may refrain from adjusting a voltage of the second node N2 of the sensing latch 210 in response to the ON voltage of the latch signal LAT (or may leave alone the voltage of the second node N2 of the sensing latch 210 without modification). Accordingly, the first node N1 of the sensing latch 210 may be maintained at the power supply voltage, and the second node N2 may be maintained at the ground voltage.

When the page buffer 13*k* belongs to the second group of the page buffers 131, 133, 135, and 137, the page buffer 13*k* may receive the third sensing signal SEN3. As the third sensing signal SEN3 is activated and is set to the ON voltage, the latch block 240 may be connected to the sensing latch 210 through the first transistor 260.

When the latch signal LAT is set to the ON voltage VON, the latch block 240 may apply a voltage level of the sensing node SN to the first node N1 of the sensing latch 210 through the first transistor 260. As described above, the first node N1 of the sensing latch 210 may be of the power supply voltage.

When a voltage of the sensing node SN is the precharged voltage, the latch block 240 may adjust a voltage of the first node N1 of the sensing latch 210 to the ground voltage through the first transistor 260 in response to the ON voltage of the latch signal LAT. In this case, the first node N1 of the sensing latch 210 may be set to the ground voltage.

When a voltage of the sensing node SN is the ground voltage, the latch block 240 may refrain from adjusting a voltage of the first node N1 of the sensing latch 210 in response to the ON voltage of the latch signal LAT (or may leave alone the voltage of the first node N1 of the sensing latch 210 without modification). Accordingly, the first node N1 of the sensing latch 210 may be maintained at the power supply voltage, and the first node N1 may be maintained at the ground voltage.

At a fifth time T5, the transfer signal TRS is activated and is set to the ON voltage VON. When the transfer signal TRS is set to the ON voltage VON, the transfer block 250 may output a signal provided through the first transistor 260 or the second transistor 270.

When the page buffer 13*k* belongs to the first group of the page buffers 132, 134, 136, and 138, the page buffer 13*k* may receive the second sensing signal SEN2. At the fifth time T5, the second sensing signal SEN2 is activated and is set to the ON voltage VON. The ON voltage VON may turn on the second transistor 270. Accordingly, the transfer block 250 may output a logical level of the second node N2 of the sensing latch 210.

When the page buffer 13*k* belongs to the second group of the page buffers 131, 133, 135, and 137, the page buffer 13*k* may receive the fourth sensing signal SEN4. At the fifth time T5, the fourth sensing signal SEN4 is activated and is set to the ON voltage VON. The ON voltage VON may turn on the second transistor 270. Accordingly, the transfer block 250 may output a logical level of the second node N2 of the sensing latch 210.

Figure 7:
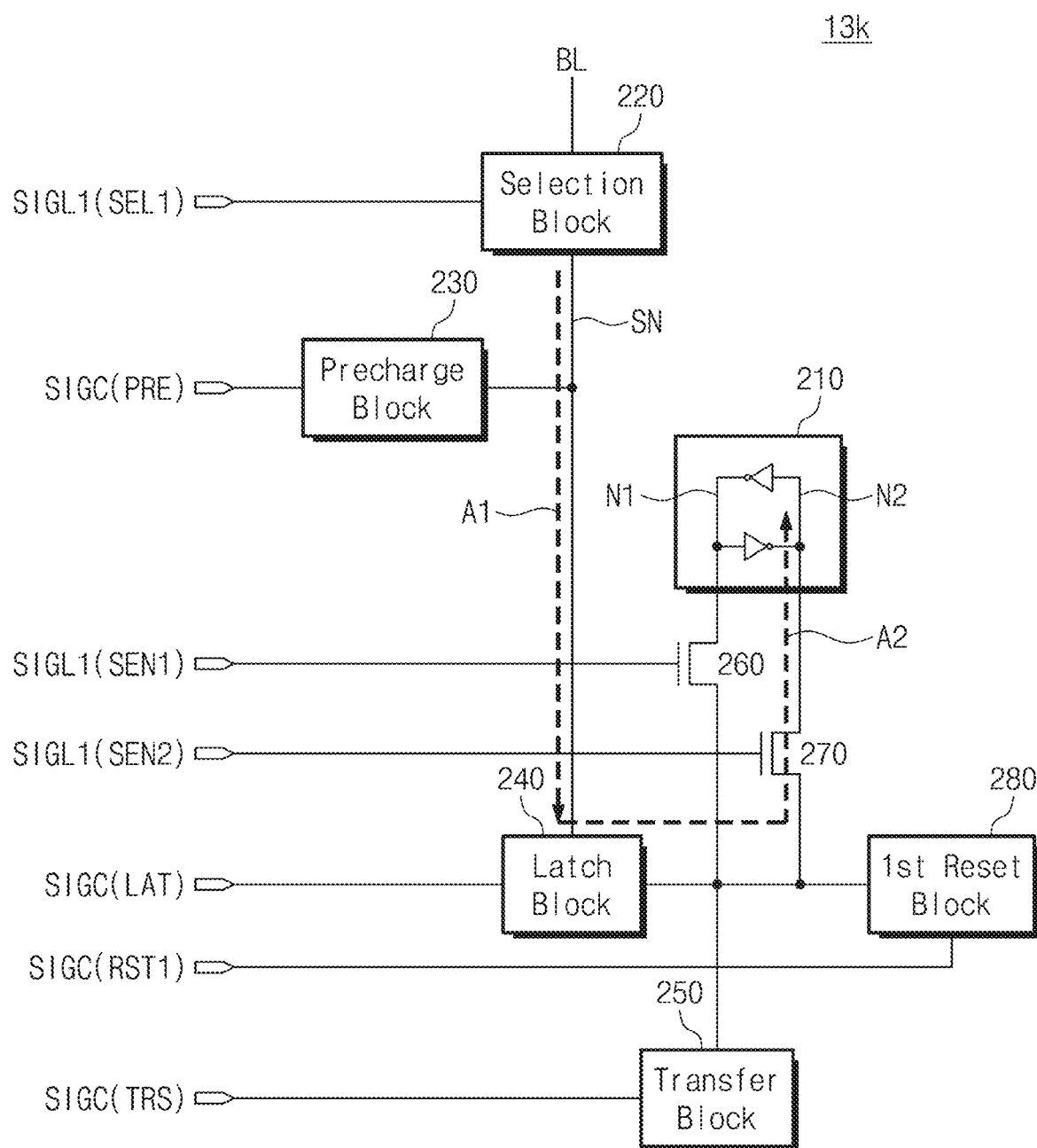
FIG. 7 illustrates an example in which a sensing operation of a page buffer is performed when the page buffer belongs to a first group of page buffers.

FIG. 7 illustrates an example in which a sensing operation of the page buffer 13*k* is performed when the page buffer 13*k* belongs to the first group of the page buffers 132, 134, 136, and 138. Referring to FIGS. 1, 3, 6, and 7, the first node N1 of the sensing latch 210 may be initialized to the high level (e.g., the power supply voltage). As marked by a first arrow A1, a voltage change of the bit line BL may be transferred to the latch block 240.

As marked by a second arrow A2, the latch block 240 may apply the voltage change of the bit line BL to the second node N2 of the sensing latch 210. Through the cross-coupled inverter structure of the sensing latch 210, the voltage change of the bit line BL may also be applied to the first node N1 of the sensing latch 210.

Figure 8:
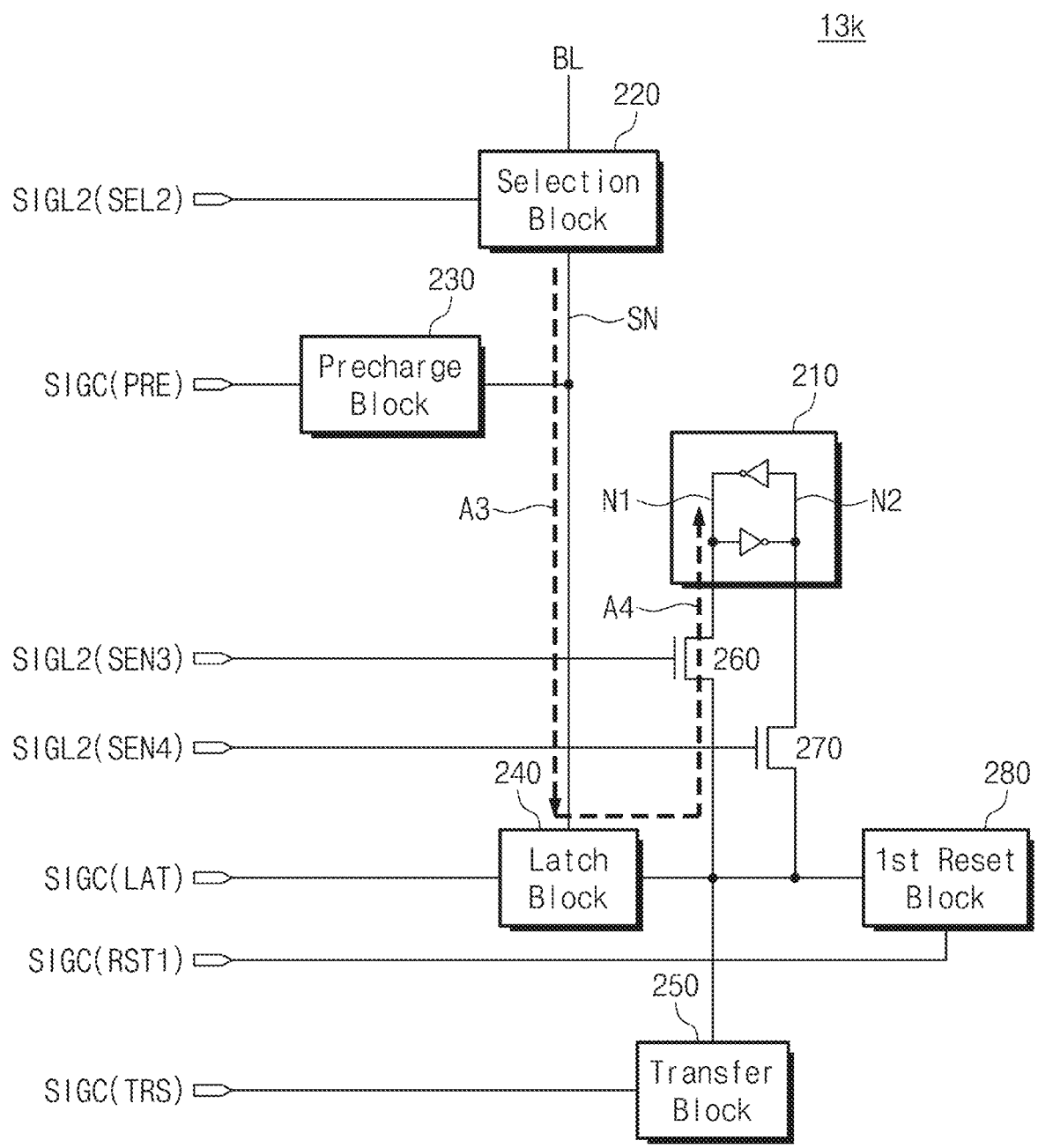
FIG. 8 illustrates an example in which a sensing operation of a page buffer is performed when the page buffer belongs to a second group of page buffers.

FIG. 8 illustrates an example in which a sensing operation of the page buffer 13*k* is performed when the page buffer 13*k* belongs to the second group of the page buffers 131, 133, 135, and 137. Referring to FIGS. 1, 3, 6, and 8, the first node N1 of the sensing latch 210 may be initialized to the high level (e.g., the power supply voltage).

As marked by a third arrow A3, a voltage change of the bit line BL may be transferred to the latch block 240. As marked by a fourth arrow A4, the latch block 240 may apply the voltage change of the bit line BL to the first node N1 of the sensing latch 210.

In the page buffer 13*k* described with reference to FIG. 7, the voltage change of the bit line BL is transferred to the second node N2 of the sensing latch 210 without passing through the internal inverter of the sensing latch 210. In the page buffer 13*k* described with reference to FIG. 8, the voltage change of the bit line BL is transferred to the first node N1 of the sensing latch 210 through the internal inverter of the sensing latch 210.

That is, the page buffer 13*k* of FIG. 8 may invert a result of sensing the voltage change of the bit line BL and may apply the inverted sensing result to the second node N2 of the sensing latch 210. The page buffer 13*k* of FIG. 7 may apply a result of sensing the voltage change of the bit line BL to the second node N2 of the sensing latch 210 without inversion.

That is, each of the first to eighth page buffers 131 to 138 may perform a sensing operation on a selected memory cell in a different manner, based on whether each page buffer belongs to any page buffer group. This sensing scheme may make it possible to accelerate a check operation in which the nonvolatile memory device 100 determines states of the selected memory cells MC_S.

Figure 9:
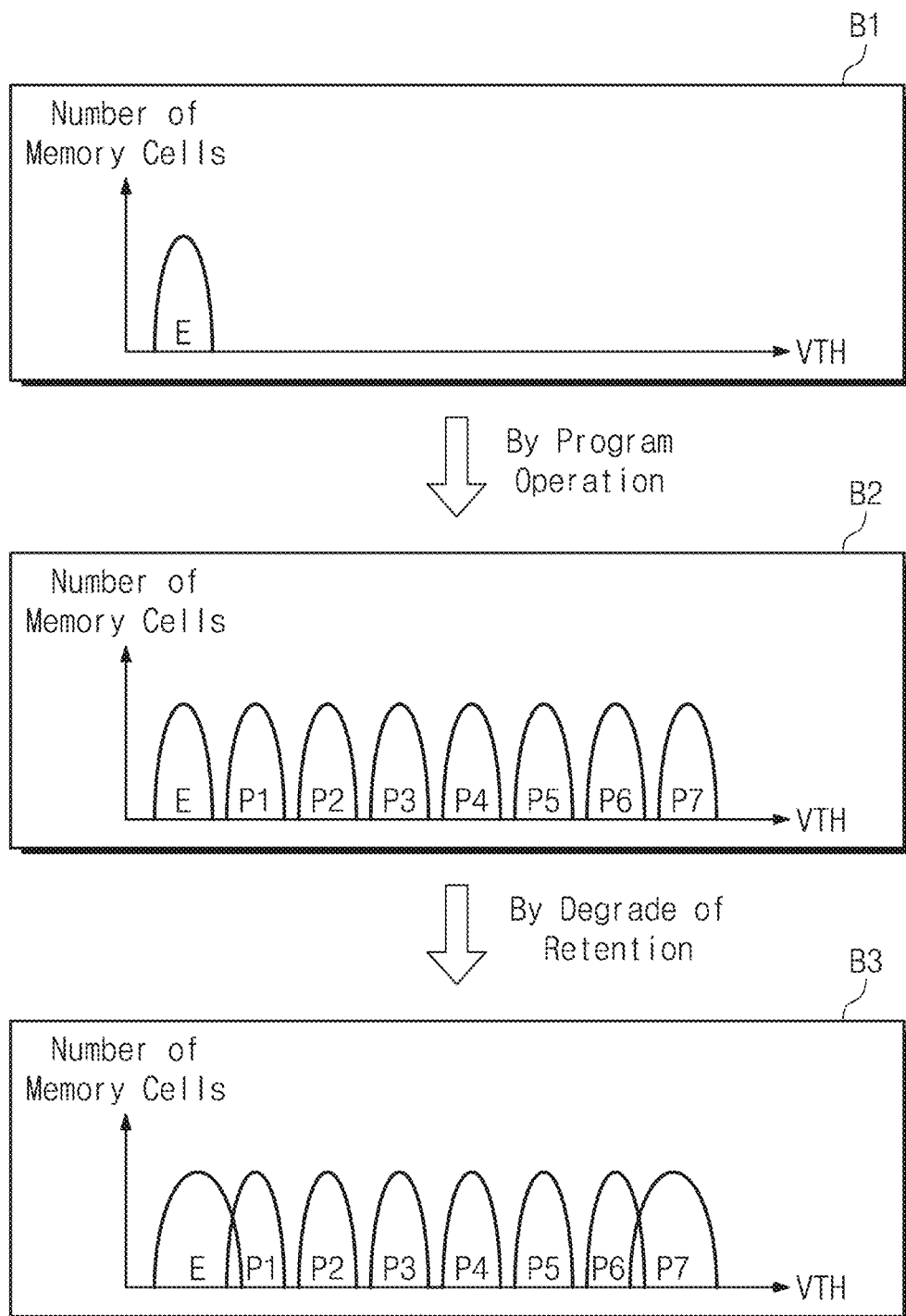
FIG. 9 illustrates an example in which threshold voltages of selected memory cells change.

FIG. 9 illustrates an example in which threshold voltages of the selected memory cells MC_S change. In FIG. 9, a vertical axis represents a threshold voltage VTH of a memory cell, and a horizontal axis represents the number of memory cells.

Referring to FIGS. 1, 3, and 9, before a program operation is performed, for example, after an erase operation is performed on the selected memory cells MC_S, threshold voltages of the selected memory cells MC_S may belong to a range corresponding to an erase state "E" as illustrated by a first box B1.

After the program operation is performed, threshold voltages of the selected memory cells MC_S may belong to ranges respectively corresponding to the erase state "E" and first to seventh program states P1 to P7 as illustrated by a second box B2. For example, each of the selected memory cells MC_S may be controlled to have a threshold voltage belonging to a range corresponding to one of the erase state "E" and the first to seventh program states P1 to P7, based on data to be written therein.

In the selected memory cells MC_S, the degradation of retention may occur in the selected memory cells MC_S over time after the program operation is performed on the selected memory cells MC_S. As the degradation of retention occurs, threshold voltages of some memory cells of the selected memory cells MC_S may be out of a range to which some memory cells belong.

For example, as boundary levels of the range to which the threshold voltages belong becomes lower or higher, the degradation of retention may become more serious. As boundary levels of the range to which the threshold voltages belong comes close to the center of the whole range of the threshold voltages, the degradation of retention may occur weakly. In some example embodiments, the degradation of retention occurring in the erase state "E" and the seventh program state P7 is highlighted and illustrated in a third box B3 of FIG. 9.

Referring to the third box B3, threshold voltages of some of memory cells having the erase state "E" may increase and may be out of a range of the erase state "E". Also, threshold voltages of some of memory cells having the seventh program state P7 may decrease and may be out of a range of the seventh program state P7.

When the degradation of retention occurs, threshold voltages of some of memory cells having the erase state "E" may move to a range of the first program state P1. Also, threshold voltages of some of memory cells having the seventh program state P7 may move to a range of the sixth program state P6. This shift may cause an error in a read operation.

In the case where an error occurs in the read operation, the nonvolatile memory device 100 may perform a check operation on the selected memory cells MC_S for the purpose of solving the error and completing the read operation. Also, the nonvolatile memory device 100 may perform the check operation through the sensing operation described with reference to FIGS. 4 and 6, thus reducing a time necessary for the check operation. For example, the controller circuitry 420 may be configured to control the nonvolatile memory 100 by sending a first request for checking states of the first memory cells and the second memory cells and a second request for reading the first memory cells and the second memory cells. In response to the second request, the controller circuitry 420 may be further configured to control the nonvolatile memory device 100 to perform a read operation on the first memory cells and the second memory cells, and then to perform the first sensing operation and the second sensing operation after the read operation.

Figure 10:
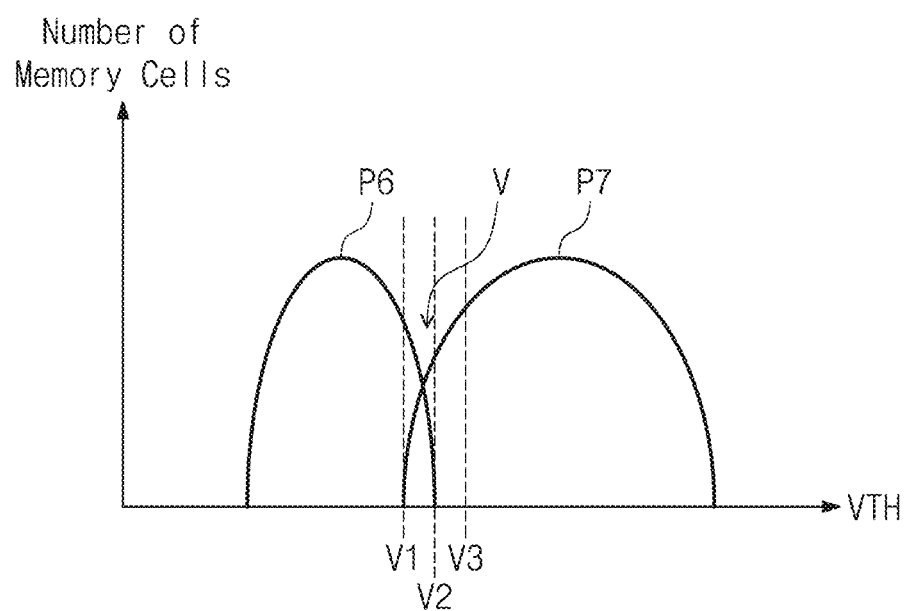
FIG. 10 is an enlarged view of a sixth program state and a seventh program state.

FIG. 10 is an enlarged view of the sixth program state P6 and the seventh program state P7. In FIG. 10, a horizontal axis represents a threshold voltage VTH of a memory cell, and a vertical axis represents the number of memory cells.

Referring to FIGS. 1, 3, and 10, a valley "V" may be formed at a point where a threshold voltage distribution of memory cells of the sixth program state P6 and a threshold voltage distribution of memory cells of the seventh program state P7 cross each other. A read error may be minimized when a read operation is performed by using the read voltage VRD (refer to FIG. 6) having a level corresponding to the valley "V".

The nonvolatile memory device 100 may be configured to perform the check operation for searching for the valley "V", and this check operation is called a "valley search." The nonvolatile memory device 100 may shorten a time necessary for the check operation by using the sensing operation described with reference to FIGS. 4 and 6.

The valley search may be performed by performing sensing operations by using levels close to a level expected as the valley "V" and counting the number of memory cells based on results of the sensing operations. For example, the nonvolatile memory device 100 may perform sensing operations by using a first voltage V1 and a second voltage V2 and may count memory cells having threshold voltages between the first voltage V1 and the second voltage V2.

The nonvolatile memory device 100 may perform sensing operations by using the second voltage V2 and a third voltage V3 and may count memory cells having threshold voltages between the second voltage V2 and the third voltage V3. The nonvolatile memory device 100 may identify the valley "V" based on a counting result.

For another example, the nonvolatile memory device 100 may output results of the sensing operations using the first voltage V1, the second voltage V2, and the third voltage V3 to an external device. The external device may perform counting operations by using the results of the sensing operations and may identify the valley "V".

Figure 11:
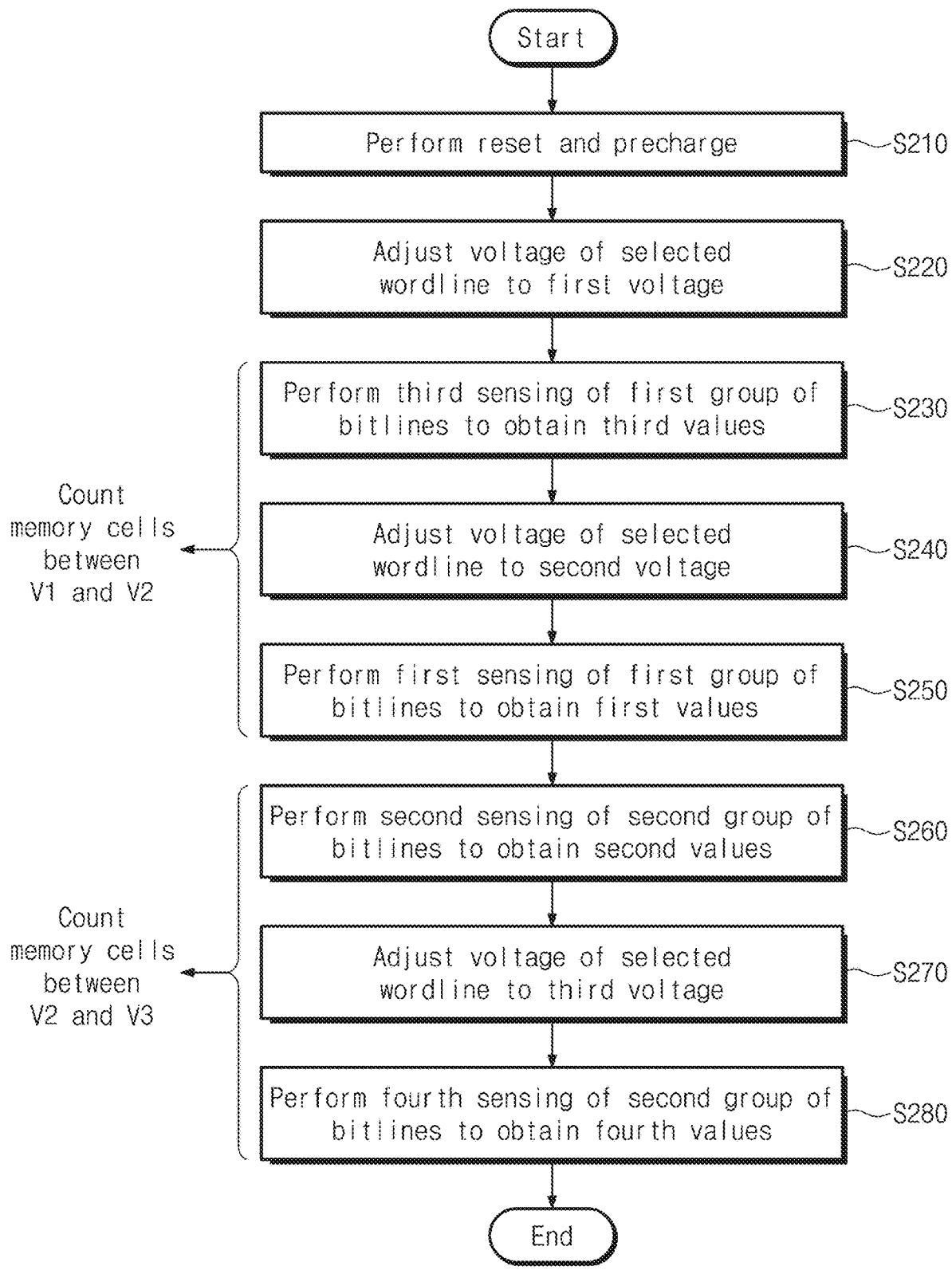
FIG. 11 is a flowchart illustrating a method in which a nonvolatile memory device according to some example embodiments of some inventive concepts performs a valley search.

FIG. 11 is a flowchart illustrating a method in which the nonvolatile memory device 100 according to some example embodiments of some inventive concepts performs a valley search. Referring to FIGS. 1, 3, 5, 10, and 11, in operation S210, the nonvolatile memory device 100 may perform a reset operation and a precharge operation.

For example, as described with reference to FIG. 6, through the second transistor 270, each of the page buffers 132, 134, 136, and 138 of the first group may set the second node N2 of the sensing latch 210 to the low level and may set the first node N1 of the sensing latch 210 to the high level. For another example, through the first transistor 260, each of the page buffers 132, 134, 136, and 138 of the first group may set the first node N1 of the sensing latch 210 to the low level and may set the second node N2 of the sensing latch 210 to the high level.

The first to eighth page buffers 131 to 138 may precharge the first to eighth bit lines BL1 to BL8 to the power supply voltage through the selection blocks 220 and the precharge blocks 230.

In operation S220, the row decoder circuitry 120 may adjust a voltage of the selected word line WL_S to the first voltage V1. In operation S230, the nonvolatile memory device 100 may perform a third sensing operation on the bit lines BL2, BL4, BL6, and BL8 of the first group and may obtain third values. The third sensing operation may be performed before the first sensing operation described with reference to FIG. 4.

In operation S240, the row decoder circuitry 120 may adjust a voltage of the selected word line WL_S to the second voltage V2. In operation S250, the nonvolatile memory device 100 may perform the first sensing operation on the bit lines BL2, BL4, BL6, and BL8 of the first group and may obtain first values. The first sensing operation may correspond to the first sensing operation described with reference to FIG. 4.

The third values and the first values may be integrated in the page buffers 132, 134, 136, and 138 of the first group. In a specific page buffer of the page buffers 132, 134, 136, and 138 of the first group, that the second node N2 of the sensing latch 210 is at the high level may indicate that a threshold voltage of a specific memory cell corresponding to the specific page buffer is greater than the first voltage V1 and is the second voltage V2 or smaller.

A case in which the second node N2 of the sensing latch 210 of the specific page buffer is at the low level may indicate that a threshold voltage of the specific memory cell is smaller than the first voltage V1 or greater than the second voltage V2. That is, the number of memory cells between the first voltage V1 and the second voltage V2 may be counted by counting the number of high levels at the second nodes N2 of latches in the page buffers 132, 134, 136, and 138 of the first group.

In operation S260, the nonvolatile memory device 100 may perform the second sensing operation on the bit lines BL1, BL3, BL5, and BL7 of the second group and may obtain second values. The second sensing operation may correspond to the second sensing operation described with reference to FIG. 4.

In operation S270, the row decoder circuitry 120 may adjust a voltage of the selected word line WL_S to the third voltage V3. In operation S280, the nonvolatile memory device 100 may perform a fourth sensing operation on the bit lines BL1, BL3, BL5, and BL7 of the second group and may obtain fourth values. The fourth sensing operation may be performed before the second sensing operation described with reference to FIG. 4.

The second values and the fourth values may be integrated in the page buffers 131, 133, 135, and 137 of the second group. In a specific page buffer of the page buffers 131, 133, 135, and 137 of the second group, that the second node N2 of the sensing latch 210 is at the high level may indicate that a threshold voltage of a specific memory cell corresponding to the specific page buffer is greater than the second voltage V2 and is the third voltage V3 or smaller.

A case in which the second node N2 of the sensing latch 210 of the specific page buffer is at the low level may indicate that a threshold voltage of the specific memory cell is smaller than the second voltage V2 or greater than the third voltage V3. That is, the number of memory cells between the second voltage V2 and the third voltage V3 may be counted by counting the number of high levels at the second nodes N2 of latches in the page buffers 131, 133, 135, and 137 of the second group.

As described with reference to FIG. 11, the number of memory cells having threshold voltages between the first voltage V1 and the second voltage V2 and the number of memory cells having threshold voltages between the second voltage V2 and the third voltage V3 may be identified by performing the third sensing operation, the first sensing operation, the second sensing operation, and the fourth sensing operation.

Because memory cells are completely counted through one operation from a reset and precharge operation to a data transfer operation, a time necessary for the check operation may be markedly shortened.

Figure 12:
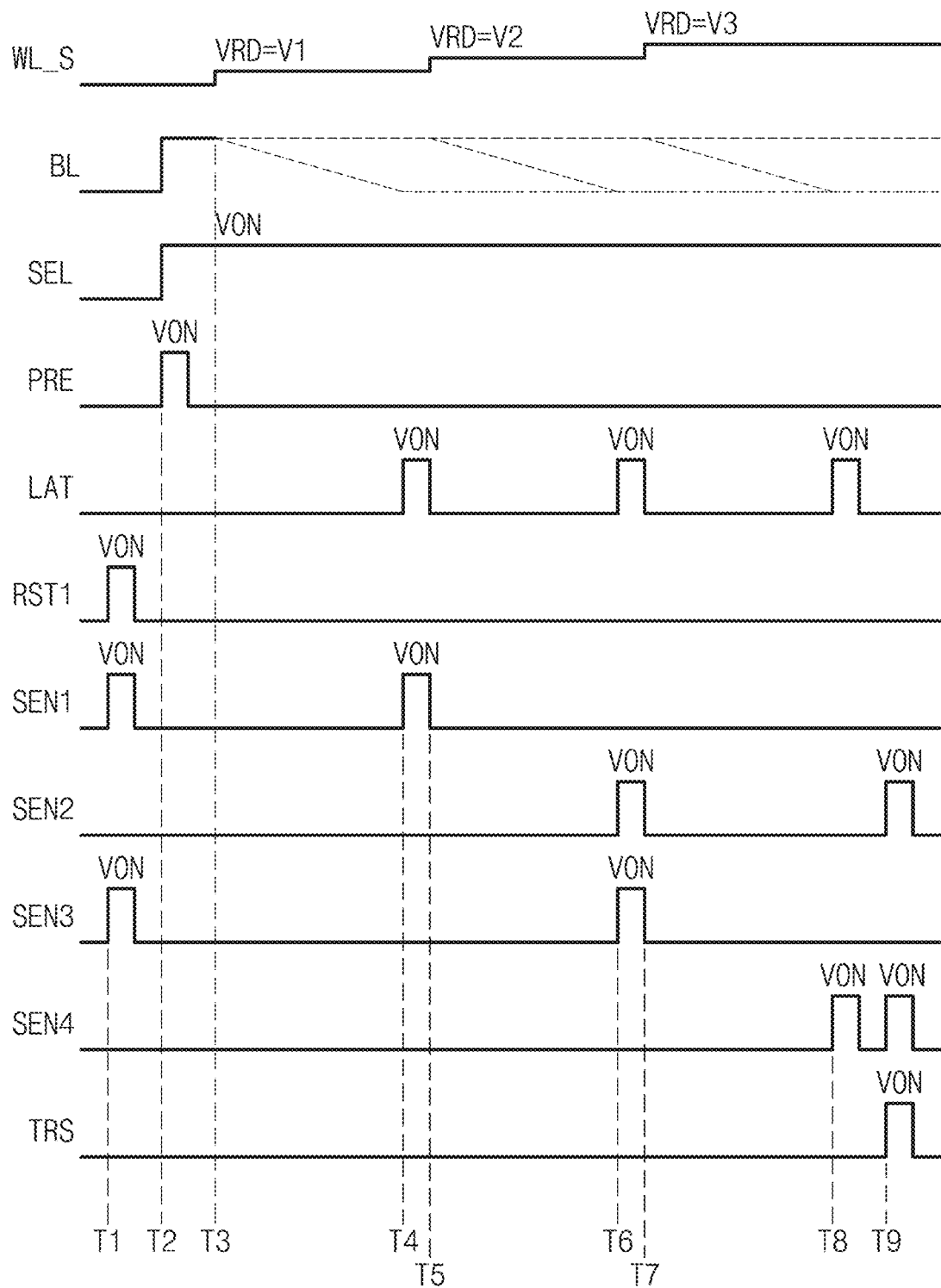
FIG. 12 is a timing diagram of signals applied to page buffer circuitry when the method of FIG. 11 is performed.

FIG. 12 is a timing diagram of signals applied to the page buffer circuitry 130 when the method of FIG. 11 is performed. Referring to FIGS. 1, 3, 5, and 12, a reset operation of a first time T1 and a precharge operation of a second time T2 are performed the same as those described with reference to FIG. 6. Thus, additional description will be omitted to avoid redundancy.

At a third time T3, the row decoder circuitry 120 may adjust the read voltage VRD to be applied to the selected word line WL_S to the first voltage V1. When a threshold voltage of a memory cell connected to the bit line BL is the first voltage V1 or smaller, a voltage of the bit line BL may be discharged to the ground voltage. When the threshold voltage of the memory cell connected to the bit line BL is greater than the first voltage V1, the voltage of the bit line BL may be maintained at a precharged voltage.

At a fourth time T4, the third sensing operation may be performed. The latch signal LAT may be activated and may be set to the ON voltage VON; the first sensing signal SEN1 may be activated and may be set to the ON voltage. As described with reference to FIG. 8, the latch block 240 may apply a result of sensing a voltage change of the bit line BL to the first node N1 of the sensing latch 210.

When the voltage of the bit line BL is the precharged voltage, the latch block 240 may change a voltage of the first node N1 of the sensing latch 210 into the ground voltage. When the voltage of the bit line BL is the ground voltage, the latch block 240 may refrain from changing a voltage of the first node N1 of the sensing latch 210 (or may leave alone the voltage of the first node N1 of the sensing latch 210 without modification). That is, through the first sensing operation, the first node N1 of the sensing latch 210 of a page buffer, which corresponds to a memory cell having a threshold voltage greater than the first voltage V1, from among the page buffers 132, 134, 136, and 138 of the first group may be set to the low level.

At a third time T5, the row decoder circuitry 120 may adjust the read voltage VRD to the second voltage V2. When the threshold voltage of the memory cell connected to the bit line BL is the second voltage V2 or smaller, a voltage of the bit line BL may be discharged to the ground voltage. When the threshold voltage of the memory cell connected to the bit line BL is greater than the second voltage V2, the voltage of the bit line BL may be maintained at the precharged voltage.

At a sixth time T6, the first sensing operation may be performed. The latch signal LAT may be activated and may be set to the ON voltage VON; the second sensing signal SEN2 may be activated and may be set to the ON voltage. As described with reference to FIG. 7, the latch block 240 may apply a result of sensing a voltage change of the bit line BL to the second node N2 of the sensing latch 210.

When the voltage of the bit line BL is the precharged voltage, the latch block 240 may change a voltage of the second node N2 of the sensing latch 210 into the ground voltage. When the voltage of the bit line BL is the ground voltage, the latch block 240 may refrain from changing a voltage of the second node N2 of the sensing latch 210 (or may leave alone the voltage of the second node N2 of the sensing latch 210 without modification). That is, through the first sensing operation, the second node N2 of the sensing latch 210 of a page buffer, which corresponds to a memory cell having a threshold voltage greater than the second voltage V2, from among the page buffers 132, 134, 136, and 138 of the first group may be set to the low level.

A case in which the second node N2 of the sensing latch 210 of the page buffer 13k is at the high level after the third sensing operation and the first sensing operation are performed may indicate that a threshold voltage of the memory cell connected to the bit line BL is between the first voltage V1 and the second voltage V2. That the second node N2 of the sensing latch 210 of the page buffer 13k is at the low level may indicate that a threshold voltage of the memory cell connected to the bit line BL is smaller than the first voltage V1 or greater than the second voltage V2.

At the sixth time T6, the second sensing operation may be further performed. The second sensing operation may be performed the same as the third sensing operation except that the second sensing operation is performed in the page buffers 131, 133, 135, and 137 of the second group. Thus, additional description will be omitted to avoid redundancy. An embodiment is described as the first sensing operation and the second sensing operation are performed at the same time. However, the first sensing operation and the second sensing operation may be sequentially performed with a time difference based on an operating characteristic and a process characteristic of the nonvolatile memory device 100.

At a third time T7, the row decoder circuitry 120 may adjust the read voltage VRD to the third voltage V3. When the threshold voltage of the memory cell connected to the bit line BL is the third voltage V3 or smaller, a voltage of the bit line BL may be discharged to the ground voltage. When the threshold voltage of the memory cell connected to the bit line BL is greater than the third voltage V3, the voltage of the bit line BL may be maintained at the precharged voltage.

At an eighth time T8, the fourth sensing operation may be performed. The fourth sensing operation may be performed the same as the first sensing operation except that the fourth sensing operation is performed in the page buffers 131, 133, 135, and 137 of the second group. Thus, additional description will be omitted to avoid redundancy.

After the fourth sensing signal, one of the page buffers 131, 133, 135 and 137 of the second group having the high level at the second node N2 indicates that corresponding memory cell has a threshold voltage between the second voltage V2 and the third voltage V3. One of the page buffers 131, 133, 135 and 137 of the second group having the low level at the second node N2 indicates that corresponding memory cell has a threshold voltage smaller than the second voltage V2 or greater than the third voltage V3.

At a ninth time T9, the second sensing signal SEN2, the fourth sensing signal SEN4, and the transfer signal TRS are activated and are set to the ON voltage VON. Logical levels of the second nodes N2 of latches in the first to eighth page buffers 131 to 138 may be output through the second transistors 270 and the transfer block 250.

Figure 13:
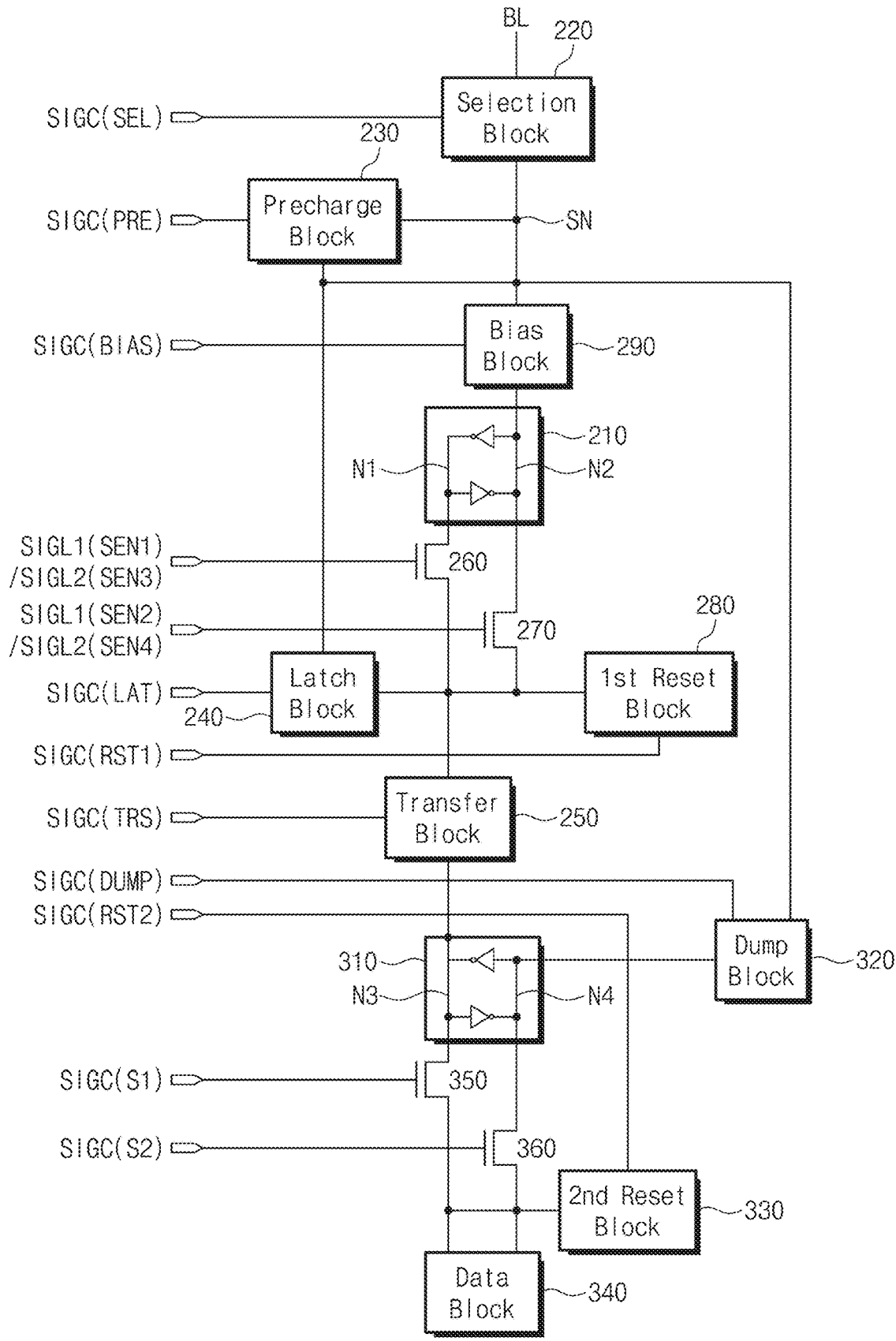
FIG. 13 illustrates an example of an i-th page buffer being another of first to eighth page buffers.

FIG. 13 illustrates an example of an i-th page buffer 13i being another of the first to eighth page buffers 131 to 138. Referring to FIGS. 1, 3, and 13, the page buffer 13i may include the sensing latch 210, the selection block 220, the precharge block 230, the latch block 240, the transfer block 250, the first transistor 260, the second transistor 270, the first reset block 280, a bias block 290, a data latch 310, a dump block 320, a second reset block 330, a data block 340, a third transistor 350, and a fourth transistor 360.

The configurations and operations of the sensing latch 210, the selection block 220, the precharge block 230, the latch block 240, the transfer block 250, the first transistor 260, the second transistor 270, the first reset block 280 may be the same as those described with reference to FIG. 5.

The bias block 290 is connected between the second node N2 of the sensing latch 210 and the sensing node SN. The bias block 290 may be controlled by a bias signal BIAS that is provided through a signal line (e.g., a sixth common signal line) of the common signal lines SIGC. That is, the bias blocks 290 of the first to eighth page buffers 131 to 138 may be simultaneously controlled in common by the bias signal BIAS of the sixth common signal line. In a program operation, in response to the bias signal BIAS, the bias block 290 may apply a voltage to the bit line BL (or may bias the bit line BL) based on a logical level of the second node N2 of the sensing latch 210.

The data latch 310 may include inverters connected between a third node N3 and a fourth node N4. The inverters may be cross coupled. The data latch 310 may receive a logical level sensed by the sensing latch 210 through the transfer block 250 and may store the received logical level. Also, the data latch 310 may receive a logical level to be transferred to the sensing latch 210 from an external device and may store the received logical level.

The dump block 320 is connected between the fourth node N4 of the data latch 310 and the sensing node SN. The dump block 320 may be controlled by a dump signal DUMP that is provided through a signal line (e.g., a seventh common signal line) of the common signal lines SIGC. That is, the dump blocks 320 of the first to eighth page buffers 131 to 138 may be simultaneously controlled in common by the dump signal DUMP of the seventh common signal line. In the program operation, in response to the dump signal DUMP, the dump block 320 may transfer a logical level of the fourth node N4 of the data latch 310 to the sensing latch 210 through the sensing node SN and the latch block 240.

The second reset block 330 is connected to the third transistor 350 and the fourth transistor 360. The second reset block 330 may be controlled by a second reset signal RST2 that is provided through a signal line (e.g., an eighth common signal line) of the common signal lines SIGC. That is, the second reset blocks 330 of the first to eighth page buffers 131 to 138 may be simultaneously controlled in common by the second reset signal RST2 of the eighth common signal line. The second reset block 330 may apply a ground voltage to the third transistor 350 or the fourth transistor 360 to the data latch 310 in response to the second reset signal RST2.

The data block 340 may be configured to output a logical level of the third node N3 or the fourth node N4 of the data latch 310 to the external device.

The third transistor 350 is connected between the third node N3 of the data latch 310 and the data block 340. The third transistor 350 may be controlled by a first signal S1 that is provided through a signal line (e.g., a ninth common signal line) of the common signal lines SIGC. That is, the third transistors 350 of the first to eighth page buffers 131 to 138 may be simultaneously controlled in common by the first signal S1 of the ninth common signal line. For example, the first signal S1 may be of a logical level input to the page buffer 13i for the purpose of the program operation.

The fourth transistor 360 is connected between the fourth node N4 of the data latch 310 and the data block 340. The fourth transistor 360 may be controlled by a second signal S2 that is provided through a signal line (e.g., a tenth common signal line) of the common signal lines SIGC. That is, the fourth transistors 360 of the first to eighth page buffers 131 to 138 may be simultaneously controlled in common by the second signal S2 of the tenth common signal line. For example, the second signal S2 may be of an inverted version of the logical level input to the page buffer 13*i* for the purpose of the program operation.

As described with reference to FIG. 13, the page buffer 13*i* may include two or more latches. The remaining latch(es) other than the sensing latch 210 may be a data latch(es). The data latch(es) may be connected to the sensing node SN through the dump block 320 and may be connected to the transfer block 250. The data latch(es) may include a reset block, a data block, and transistors between the data block and the data latch(es). The data latch(es) may be configured to exchange a logical level between the sensing latch 210 and the external device.

In some example embodiments, the page buffers 132, 134, 136, and 138 of the first group may be configured to perform sensing on the bit lines BL2, BL4, BL6, and BL8 of the first group by using the sensing latch 210 and to perform sensing on the bit lines BL1, BL3, BL5, and BL7 of the second group by using the data latch 310. In this case, a node between the third transistor 350 and the data block 340 and a node between the fourth transistor 360 and the data block 340 may be further connected to the latch block 240.

When the page buffer 13*i* belongs to the first group of the page buffers 132, 134, 136, and 138, the first transistor 260 may be controlled by the first sensing signal SEN1 that is transferred through a signal line (e.g., a first line) of the first signal lines SIGL1. The second transistor 270 may be controlled by the second sensing signal SEN2 that is provided through a signal line (e.g., a second line) of the first signal lines SIGL1.

When the page buffer 13*i* belongs to the second group of the page buffers 131, 133, 135, and 137, the third transistor 350 may be controlled by the third sensing signal SEN3 that is transferred through a signal line (e.g., a first line) of the second signal lines SIGL2. The fourth transistor 360 may be controlled by the fourth sensing signal SEN4 that is provided through a signal line (e.g., a second line) of the second signal lines SIGL2.

Figure 14:
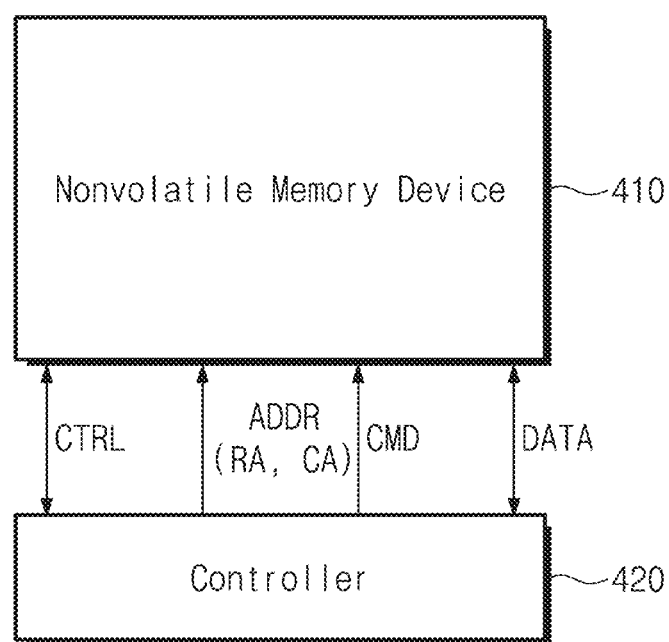
FIG. 14 is a block diagram illustrating a storage device according to some example embodiments of some inventive concepts.

FIG. 14 is a block diagram illustrating a storage device 400 according to some example embodiments of some inventive concepts. Referring to FIG. 14, the storage device 400 may include a nonvolatile memory device 410 and controller circuitry 420.

The nonvolatile memory device 410 may include the nonvolatile memory device 100 according to some example embodiments of some inventive concepts. The controller circuitry 420 may be configured to control the nonvolatile memory device 410. The controller circuitry 420 may provide a command CMD and an address ADDR including a row address RA and a column address CA to the nonvolatile memory device 410 through a first channel.

The controller circuitry 420 may exchange data "DATA" with the nonvolatile memory device 410 through the first channel. The data "DATA" may include two or more bits, each of which may include a logical level indicating one of a high level and a low level. The controller circuitry 420 may exchange a control signal CTRL with the nonvolatile memory device 410 through a second channel.

Figure 15:
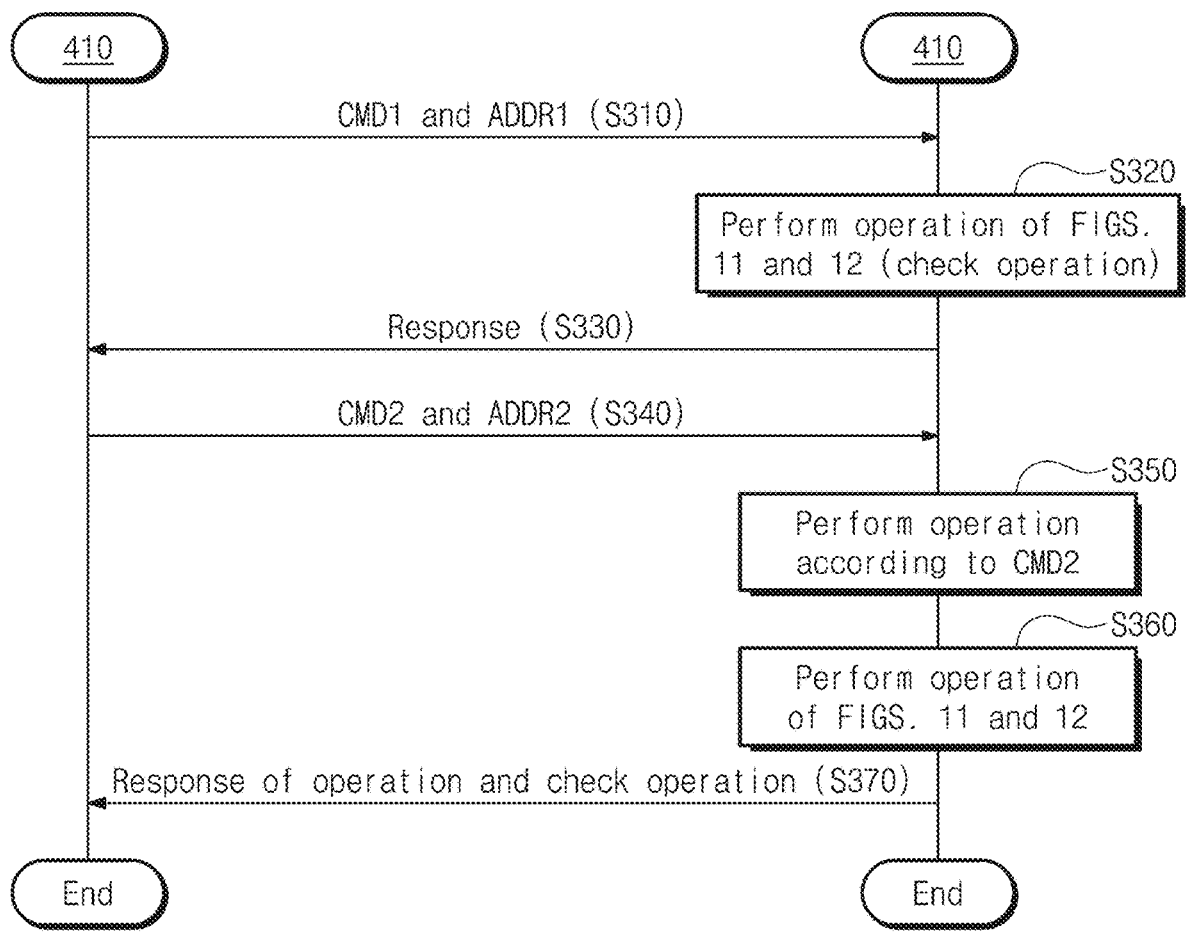
FIG. 15 is a flowchart illustrating an operating method of a storage device according to some example embodiments of some inventive concepts.

FIG. 15 is a flowchart illustrating an operating method of the storage device 400 according to some example embodiments of some inventive concepts. Referring to FIG. 15, in operation S310, the controller circuitry 420 may transmit a first command CMD1 and a first address ADDR1 to the nonvolatile memory device 410. For example, the first command CMD1 may have a format for requesting the check operation.

In response to the first command CMD1, in operation S320, the nonvolatile memory device 410 may perform the operation described with reference to FIGS. 11 and 12, for example, the check operation including the valley search on memory cells that the first address ADDR1 indicates. In operation S330, the nonvolatile memory device 410 may transfer a response of the check operation to the controller circuitry 420.

For example, the response may include the data "DATA" indicating values of memory cells, each of which has a threshold voltage between the first voltage V1 and the second voltage V2 and which are obtained in operation S230 and operation S250 of FIG. 11. Also, the response may include the data "DATA" indicating values of memory cells, each of which has a threshold voltage between the second voltage V2 and the third voltage V3 and which are obtained in operation S260 and operation S280 of FIG. 11.

The controller circuitry 420 may count high levels from the response to calculate the number of memory cells each having a threshold voltage between the first voltage V1 and the second voltage V2 and to calculate the number of memory cells each having a threshold voltage between the second voltage V2 and the third voltage V3. The controller circuitry 420 may identify the valley "V" based on the counts thus calculated. The controller circuitry 420 may adjust a parameter (e.g., a level of the read voltage VRD) for accessing the nonvolatile memory device 100 based on the identified valley "V".

In operation S340, the controller circuitry 420 may transmit a second command CMD2 and a second address ADDR2 to the nonvolatile memory device 410. For example, the second command CMD2 may have a format for requesting a read operation.

In response to the second command CMD2, in operation S350, the nonvolatile memory device 410 may perform an operation directed by the second command CMD2, for example, the read operation on memory cells that the second address ADDR2 indicates. Based on the read operation, in operation S360, the nonvolatile memory device 410 may perform the operation described with reference to FIGS. 11 and 12, for example, the check operation including the valley search on memory cells that the second address ADDR2 indicates.

In operation S370, the nonvolatile memory device 410 may transfer a response of the operation directed by the second command CMD2, for example, a result of the read operation and the check operation to the controller circuitry 420. The response of the read operation may include data read from the memory cells that the second address ADDR2 indicates. The response of the check operation may include values obtained according to the method of FIG. 11.

As discussed herein, some example embodiments may include various forms of processing circuitry, such as row decoder circuitry 120, page buffer circuitry 130, data input and output circuitry 140, control logic circuitry 150, and/or controller circuitry 420. In some example embodiments, the processing circuitry may include hardware such as logic circuits; a hardware/software combination, such as a processor executing software; or a combination thereof. For example, a processor may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Further, some example embodiments may be described with an example architecture, but other example embodiments the scope of the present disclosure may include a different architecture without departing from the scope of the present disclosure. For example, in FIG. 1, the nonvolatile memory device 100 includes a memory cell array 110, row decoder circuitry 120, page buffer circuitry 130, data input and output circuitry 140, and control logic circuitry 150. However, it is to be appreciated that other example embodiments may include a different organization of processing circuitry, such as more or fewer components; a different set of relationships and interconnections; and/or a different arrangement of functionality among the components. In some example embodiments, a first component may include a second component, while in other example embodiments, the first component and the second component may be discrete and separate. In some example embodiments, functionality may be implemented by a single component, while in other example embodiments, functionality may be distributed over two or more components. In various example embodiments, two or more components may operate synchronously and/or asynchronously. In various example embodiments, two or more components may operate consecutively and/or concurrently.

According to some example embodiments of some inventive concepts, a nonvolatile memory device performs a first sensing operation on first memory cells and performs a second sensing operation on second memory cells, and a result of one of the first sensing operation and the second sensing operation is inverted and obtained. Accordingly, a nonvolatile memory device that provides a sensing operation making it possible to accelerate a check operation for checking states of data stored in the first memory cells and the second memory cells, an operating method of the nonvolatile memory device, and a storage device including the nonvolatile memory device.

Figure 16:
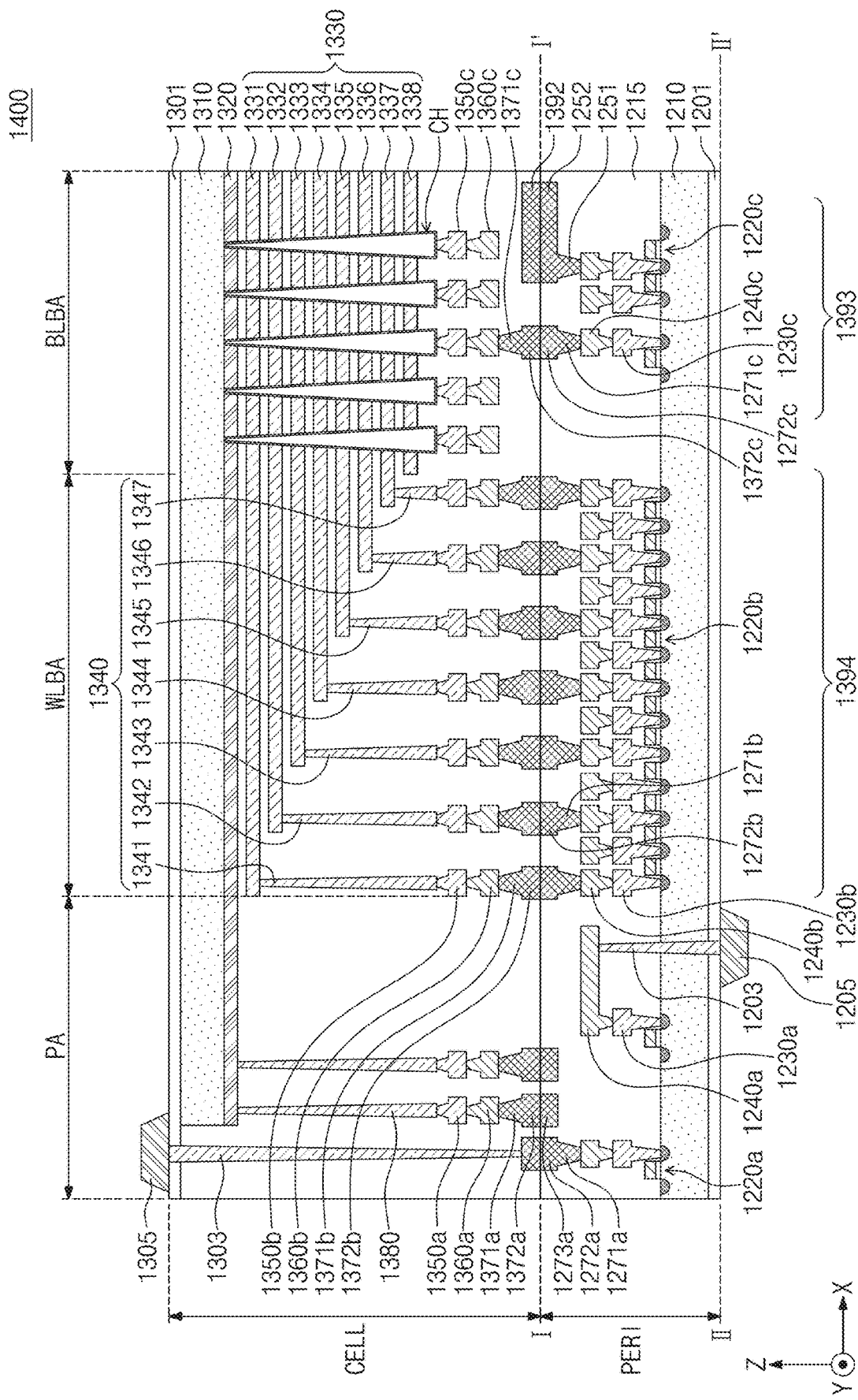
FIG. 16 is a diagram illustrating an exemplary nonvolatile memory device.

FIG. 16 is a diagram illustrating an exemplary nonvolatile memory device 1400. Referring to FIG. 16, the nonvolatile memory device 1400 may correspond to the nonvolatile device 100 in FIG. 1. In FIG. 16, the Z-direction may correspond to an opposite direction of the direction perpendicular to the substrate SUB in FIG. 2. The nonvolatile memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In an example embodiment, the first metal layers 1230a, 1230b, and 1230c may be formed of tungsten having relatively high resistance, and the second metal layers 1240a, 1240b, and 1240c may be formed of copper having relatively low resistance.

In an example embodiment illustrate in FIG. 16, although the first metal layers 1230a, 1230b, and 1230c and the second metal layers 1240a, 1240b, and 1240c are shown and described, they are not limited thereto, and one or more metal layers may be further formed on the second metal layers 1240a, 1240b, and 1240c. At least a portion of the one or more metal layers formed on the second metal layers 1240a, 1240b, and 1240c may be formed of aluminum or the like having a lower resistance than those of copper forming the second metal layers 1240a, 1240b, and 1240c.

The interlayer insulating layer 1215 may be disposed on the first substrate 1210 and cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b in the peripheral circuit region PERI may be electrically connected to upper bonding metals 1371b and 1372b in the cell region CELL in a bonding manner, and the lower bonding metals 1271b and 1272b and the upper bonding metals 1371b and 1372b may be formed of aluminum, copper, tungsten, or the like.

Further, the upper bonding metals 1371b and 1372b in the cell region CELL may be referred as first metal pads and the lower bonding metals 1271b and 1272b in the peripheral circuit region PERI may be referred as second metal pads.

The cell region CELL may include at least one memory block. The cell region CELL may include a second substrate 1310 and a common source line 1320. On the second substrate 1310, a plurality of word lines 1331 to 1338 (i.e., 1330) may be stacked in a direction (a Z-axis direction), perpendicular to an upper surface of the second substrate 1310. At least one string select line and at least one ground select line may be arranged on and below the plurality of word lines 1330, respectively, and the plurality of word lines 1330 may be disposed between the at least one string select line and the at least one ground select line.

In the bit line bonding area BLBA, a channel structure CH may extend in a direction, perpendicular to the upper surface of the second substrate 1310, and pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350c and a second metal layer 1360c. For example, the first metal layer 1350c may be a bit line contact, and the second metal layer 1360c may be a bit line. In an example embodiment, the bit line 1360c may extend in a first direction (a Y-axis direction), parallel to the upper surface of the second substrate 1310.

In an example embodiment illustrated in FIG. 16, an area in which the channel structure CH, the bit line 1360c, and the like are disposed may be defined as the bit line bonding area BLBA. In the bit line bonding area BLBA, the bit line 1360c may be electrically connected to the circuit elements 1220c providing a page buffer 1393 in the peripheral circuit region PERI. For example, the bit line 1360c may be connected to upper bonding metals 1371c and 1372c in the cell region CELL, and the upper bonding metals 1371c and 1372c may be connected to lower bonding metals 1271c and 1272c connected to the circuit elements 1220c of the page buffer 1393.

In the word line bonding area WLBA, the plurality of word lines 1330 may extend in a second direction (an X-axis direction), parallel to the upper surface of the second substrate 1310, and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the second direction. A first metal layer 1350b and a second metal layer 1360b may be connected to an upper portion of the plurality of cell contact plugs 1340 connected to the plurality of word lines 1330, sequentially. The plurality of cell contact plugs 1340 may be connected to the circuit region PERI by the upper bonding metals 1371b and 1372b of the cell region CELL and the lower bonding metals 1271b and 1272b of the peripheral circuit region PERI in the word line bonding area WLBA.

The plurality of cell contact plugs 1340 may be electrically connected to the circuit elements 1220b providing a row decoder 1394 in the peripheral circuit region PERI. In an example embodiment, operating voltages of the circuit elements 1220b providing the row decoder 1394 may be different than operating voltages of the circuit elements 1220c providing the page buffer 1393. For example, operating voltages of the circuit elements 1220c providing the page buffer 1393 may be greater than operating voltages of the circuit elements 1220b providing the row decoder 1394.

A common source line contact plug 1380 may be disposed in the external pad bonding area PA. The common source line contact plug 1380 may be formed of a conductive material such as a metal, a metal compound, polysilicon, or the like, and may be electrically connected to the common source line 1320. A first metal layer 1350a and a second metal layer 1360a may be stacked on an upper portion of the common source line contact plug 1380, sequentially. For example, an area in which the common source line contact plug 1380, the first metal layer 1350a, and the second metal layer 1360a are disposed may be defined as the external pad bonding area PA.

Input-output pads 1205 and 1305 may be disposed in the external pad bonding area PA. Referring to FIG. 16, a lower insulating film 1201 covering a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220a, 1220b, and 1220c disposed in the peripheral circuit region PERI through a first input-output contact plug 1203, and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 16, an upper insulating film 1301 covering the upper surface of the second substrate 1310 may be formed on the second substrate 1310, and a second input-output pad 1305 may be disposed on the upper insulating layer 1301. The second input-output pad 1305 may be connected to at least one of the plurality of circuit elements 1220a, 1220b, and 1220c disposed in the peripheral circuit region PERI through a second input-output contact plug 1303.

According to embodiments, the second substrate 1310 and the common source line 1320 may not be disposed in an area in which the second input-output contact plug 1303 is disposed. Also, the second input-output pad 1305 may not overlap the word lines 1330 in the third direction (the Z-axis direction). Referring to FIG. 16, the second input-output contact plug 1303 may be separated from the second substrate 1310 in a direction, parallel to the upper surface of the second substrate 1310, and may pass through the interlayer insulating layer 1315 of the cell region CELL to be connected to the second input-output pad 1305 and the lower bonding metals 1271a and 1272a of the peripheral circuit area PERI.

According to embodiments, the first input-output pad 1205 and the second input-output pad 1305 may be selectively formed. For example, the memory device 1400 may include only the first input-output pad 1205 disposed on the first substrate 1210 or the second input-output pad 1305 disposed on the second substrate 1310. Alternatively, the memory device 1400 may include both the first input-output pad 1205 and the second input-output pad 1305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1400 may include a lower metal pattern 1273a, corresponding to an upper metal pattern 1372a formed in an uppermost metal layer of the cell region CELL, and having the same shape as the upper metal pattern 1372a of the cell region CELL, in an uppermost metal layer of the peripheral circuit region PERI. In the peripheral circuit region PERI, the lower metal pattern 1273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a Cu—Cu bonding.

Further, the bit line bonding area BLBA, an upper metal pattern 1392, corresponding to a lower metal pattern 1252 formed in the uppermost metal layer of the peripheral circuit region PERI, and having the same shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While some examples of inventive concepts have been described with reference to some example embodiments thereof, it will be apparent to those of ordinary skill in the art that various changes and modifications may be made thereto without departing from the spirit and scope of some inventive concepts as set forth in the following claims.

What is claimed is:

1. A nonvolatile memory device comprising:
a memory cell region including:
first metal pads; and
a memory cell array including memory cells arranged in rows and columns; and
a peripheral circuit region including:
second metal pads;
row decoder circuitry connected to the rows of the memory cells through word lines, and configured to control voltages of the word lines; and
page buffer circuitry connected to the columns of the memory cells through bit lines, and including first transistors configured to transfer voltages of the bit lines to be sensed and second transistors configured to transfer the voltages of the bit lines to be inverted and sensed, wherein the page buffer circuitry is configured to,
obtain first values by performing a first sensing operation on first bit lines of the bit lines through the first transistors, and
obtain second values by performing a second sensing operation on second bit lines of the bit lines through the second transistors, wherein
the peripheral circuit region is vertically connected to the memory cell region by the first metal pads and the second metal pads,
the row decoder circuitry is connected to the word lines through a part of the second metal pads and a part of the first metal pads, and
the page buffer circuitry is connected to the bit lines through another part of the second metal pads and another part of the first metal pads.

2. The nonvolatile memory device of claim 1, wherein the first bit lines are different from the second bit lines.

3. The nonvolatile memory device of claim 1,
wherein the page buffer circuitry includes:
first page buffers connected to the first bit lines, respectively, and
second page buffers connected to the second bit lines, respectively,
wherein each of the first page buffers and the second page buffers is connected to a corresponding bit line and includes a sensing latch including a first node and a second node,
wherein, in the first sensing operation, the first page buffers are configured to store values respectively corresponding to first voltages of the first bit lines at the first nodes of the sensing latches of the first page buffers through the first transistors of the first page buffers as the first values, respectively, and
wherein, in the second sensing operation, the second page buffers are configured to store values respectively corresponding to second voltages of the second bit lines at the second nodes of the sensing latches of the second page buffers through the second transistors of the second page buffers as the second values, respectively.

4. The nonvolatile memory device of claim 3,
wherein the first transistors of the first page buffers are controlled in common by a first signal line,
wherein the second transistors of the first page buffers are controlled in common by a second signal line,
wherein the first transistors of the second page buffers are controlled in common by a third signal line different from the first signal line, and
wherein the second transistors of the second page buffers are controlled in common by a fourth signal line different from the second signal line.

5. The nonvolatile memory device of claim 3,
wherein each of the first page buffers and the second page buffers includes a selection block configured to selectively connect the corresponding bit line and the sensing latch, and
wherein the selection block of each of the first page buffers and the second page buffers is configured to be controlled by a common signal line.

6. The nonvolatile memory device of claim 1,
wherein the page buffer circuitry is configured to perform the first sensing operation and the second sensing operation, and
wherein the row decoder circuitry is configured to apply a voltage to a word line selected from the word lines and maintain the voltage.

7. The nonvolatile memory device of claim 1, wherein the page buffer circuitry includes:
first page buffers connected to the first bit lines, respectively, and
second page buffers connected to the second bit lines, respectively, and
wherein the page buffer circuitry is further configured to apply a precharge voltage to the bit lines before performing the first sensing operation and the second sensing operation.

8. The nonvolatile memory device of claim 7, wherein, after applying the precharge voltage and before the first sensing operation and the second sensing operation, the first page buffers are further configured to obtain third values by performing a third sensing operation on the first bit lines through the second transistors.

9. The nonvolatile memory device of claim 8, wherein the page buffer circuitry is further configured to refrain from performing a sensing operation on the second bit lines during the third sensing operation on the first bit lines.

10. The nonvolatile memory device of claim 8, wherein the row decoder circuitry is configured to adjust a voltage of a word line selected from the word lines after performing the third sensing operation.

11. The nonvolatile memory device of claim 1, wherein the memory cell region is formed on a first wafer and the peripheral circuit region is formed on a second wafer.

12. The nonvolatile memory device of claim 1, wherein the first metal pads and the second metal pads are connected by bonding manner.

13. The nonvolatile memory device of claim 1, wherein the first metal pads and the second metal pads are formed of copper.

14. A storage device comprising:
a nonvolatile memory device including first memory cells connected to first bit lines and second memory cells connected to second bit lines; and
controller circuitry configured to control the nonvolatile memory device to,
perform a first sensing operation of reading the first memory cells,
perform a second sensing operation of reading the first memory cells and the second memory cells after the first sensing operation, and perform a third sensing operation of reading the second memory cells after the second sensing operation, wherein the nonvolatile memory device comprises:
a memory cell region including first metal pads, the first memory cells and the second memory cells; and
a peripheral circuit region including second metal pads and access the memory cell region under the control of the controller circuitry, and wherein the peripheral circuit region is vertically connected to the memory cell region by the first metal pads and the second metal pads, the first metal pads extending from the memory cell region along a first direction, and the second metal pads extending from the peripheral circuit region along a second direction opposite to the first direction.

15. The storage device of claim 14, wherein the controller circuitry is further configured to control the nonvolatile memory device to,
store a result of the first sensing operation for the first memory cells in the first sensing operation, and
store a result of the second sensing operation for the first memory cells, the result of the second sensing operation being inverted before stored.

16. The storage device of claim 14, wherein the controller circuitry is further configured to cause the nonvolatile memory device to adjust a level of a read voltage to be applied to the first memory cells and the second memory cells during the first sensing operation, the second sensing operation, and the third sensing operation.

17. The storage device of claim 14,
wherein the controller circuitry is further configured to control the nonvolatile memory device by sending a first request for checking states of the first memory cells and the second memory cells and a second request for reading the first memory cells and the second memory cells, and
wherein, in response to the second request, the controller circuitry is further configured to control the nonvolatile memory device to,
perform a read operation on the first memory cells and the second memory cells, and
perform the first sensing operation, the second sensing operation, and the third sensing operation after the read operation.

18. An operating method of a nonvolatile memory device which includes first memory cells, second memory cells, first bit lines connected to the first memory cells, and second bit lines connected to the second memory cells, the method comprising:
applying a precharge voltage to the first bit lines and the second bit lines;
performing a first sensing operation on the first bit lines to obtain first values;
performing a second sensing operation on the second bit lines to obtain second values; and
inverting ones of the first values and the second values,
wherein the nonvolatile memory device comprises:
a memory cell region including first metal pads, the first memory cells and the second memory cells; and
a peripheral circuit region including second metal pads and connected to the memory cell region through the second metal pads, the first metal pads, word lines and the bit lines, and wherein
the peripheral circuit region is vertically connected to the memory cell region by the first metal pads and the second metal pads,
the first metal pads extending from the memory cell region along a first direction, and
the second metal pads extending from the peripheral circuit regions along a second direction opposite to the first direction.

19. The method of claim 18, further comprising:
performing a third sensing operation on the first bit lines to obtain third values, after the applying of the precharge voltage and before the first sensing operation and the second sensing operation;
performing a fourth sensing operation on the second bit lines to obtain fourth values, after the third sensing operation; and
integrating results of the first sensing operation and the third sensing operation, integrating results of the second sensing operation and the fourth sensing operation, and outputting the integrated results.

* * * * *